United States Patent

Tomari et al.

[11] Patent Number: 6,127,052
[45] Date of Patent: Oct. 3, 2000

[54] SUBSTRATE AND METHOD FOR PRODUCING IT

[75] Inventors: Yoshiaki Tomari, Yokohama; Yasuyuki Nakai, Tokyo, both of Japan

[73] Assignee: Canon Kabushiki Kaisha, Tokyo, Japan

[21] Appl. No.: 09/093,351

[22] Filed: Jun. 9, 1998

[30] Foreign Application Priority Data

Jun. 10, 1997 [JP] Japan .................................. 9-152236
Mar. 12, 1998 [JP] Japan ................................ 10-061233
Mar. 12, 1998 [JP] Japan ................................ 10-061234

[51] Int. Cl.⁷ ............................ C25D 3/12; B32B 15/01
[52] U.S. Cl. ...................... 428/680; 428/434; 428/668; 428/935; 428/936; 427/98
[58] Field of Search .................... 428/432, 433, 428/434, 450, 615, 670, 620, 637, 668, 935, 936, 655, 657, 680; 427/98, 304, 305

[56] References Cited

U.S. PATENT DOCUMENTS

| | | | |
|---|---|---|---|
| 3,664,860 | 5/1972 | Kamiya et al. | 117/47 |
| 3,930,896 | 1/1976 | Takahama et al. | 428/432 |
| 4,259,409 | 3/1981 | Arnold | 428/428 |
| 4,849,303 | 7/1989 | Graham et al. | 428/670 |
| 5,206,055 | 4/1993 | Iacovangelo | 427/304 |

FOREIGN PATENT DOCUMENTS

| | | |
|---|---|---|
| 4-017211 | 1/1992 | Japan . |
| 6-061619 | 3/1994 | Japan . |
| 8-227656 | 9/1996 | Japan . |
| 982621 | 2/1965 | United Kingdom . |
| 1030545 | 5/1966 | United Kingdom . |
| 1380890 | 1/1975 | United Kingdom . |

OTHER PUBLICATIONS

Patent Abstracts of Japan, vol. 96, No. 2, Feb. 29, 1996; publication No. 07268640.
Patent Abstracts of Japan, vol. 97, No. 2, Feb. 28, 1997; publication No. 08271869.
Patent Abstracts of Japan, vol. 6, No. 132, Jul. 17, 1982; publication No. 57058341.
Patent Abstracts of Japan, vol. 18, No. 299, Jun. 8, 1994; publication No. 06061619.

Primary Examiner—Deborah Jones
Assistant Examiner—Stephen Stein
Attorney, Agent, or Firm—Fitzpatrick, Cella, Harper & Scinto

[57] ABSTRACT

A substrate wherein a layer comprising a principal component of nickel and a layer comprising a principal component of palladium are deposited on a glass substrate and wherein an electroconductive layer is deposited on the palladium layer.

29 Claims, 9 Drawing Sheets

TIME/min

SUBSTRATE AND METHOD FOR PRODUCING IT

BACKGROUND OF THE INVENTION

1. Field of the Invention

The present invention relates to a substrate applicable to a circuit board etc., constructed by forming an electroconductive pattern on a glass substrate, and a method for producing the substrate.

2. Related Background Art

There are the following examples conventionally known as substrates in which the electroconductive pattern is formed on the glass substrate, and production methods thereof. As an example, an Ag paste is printed on the glass substrate to form a desired electroconductive pattern and it is baked to be fixed. In another example, a semiconductor layer of ZnO or $WO_3$ is formed on the glass substrate, thereafter a layer of Pd, Pt, Au, Ag, or the like is deposited thereon by plating, and then an electroconductive layer of Cu or the like is deposited by plating to form the electroconductive pattern (Japanese Laid-open Patent Applications No. 4-17211 and No. 6-61619).

In still another example, an undercoat metal layer of nickel is formed on the glass substrate by electroless plating, thereafter an insulating layer is formed in a predetermined pattern thereon, then a metal layer is deposited over exposed portions of the undercoat metal layer by electroplating of copper, the aforementioned insulating layer is then removed, and exposed portions of the undercoat metal layer of nickel is etched away to form a desired electroconductive pattern (Japanese Laid-Open Patent Application No. 8-227656).

The plated layers on the glass substrate, obtained by the conventional treating methods, had the following problems, however. In the case where the Ag paste is printed on the glass substrate to form the electroconductive pattern, lead glass needs to be added in the paste in order to enhance adhesion to the glass substrate, which increases wire resistance of the electroconductive pattern finally obtained, as compared with bulk Ag. In addition, a heat treatment near 500° C. is necessary for increasing adhesive strength between wires and the substrate, which poses additional problems that the energy cost becomes higher and that warp or strain is more likely to occur in the case wherein the substrate is soda lime glass or the like.

Similarly, in the case wherein the semiconductor layer of ZnO or $WO_3$ is formed on the glass substrate so as to serve as an undercoat layer, a heat treatment at high temperature is necessary in the film-forming process for forming the semiconductor layer of these materials, and thus warp or strain of the glass substrate is likely to occur.

When only the nickel plated layer formed on the glass substrate by electroless plating is used as an undercoat layer, it obviates the need for baking at high temperature necessary in the printing process, but it does not mean that the heat treatment is unnecessary for the substrate. In the case of this process being used, the heat treatment is also necessitated in order to enhance the adhesive strength at the interface between the glass substrate and the nickel plated layer. The reason is that if the plated layer were formed in the thickness enough for wires on the substrate with omitting this heat treatment the risk of exfoliation would increase due to increase in membrane stress.

When the electroless nickel plated layer is baked, for example, at the temperature of about 150° C.–300° C., there will arise, however, a problem that an oxide film is formed in the surface of the plated layer to degrade adhesion to a deposit film thereafter. If this oxide film is attempted to remove with a chemical, there will often arise a problem that not only the oxide film but also the interface portion between the glass substrate and the nickel plated layer are damaged because of influence of the chemical, so as to degrade the adhesion.

SUMMARY OF THE INVENTION

The present invention has been accomplished in view of the problems described above. An object of the present invention is to provide a substrate having a layer structure on a glass substrate with sufficient adhesion between the glass substrate and the electroconductive pattern, without a need for using such a high-temperature process as to cause warp or strain in the glass substrate, and a method for producing the substrate.

Another object of the present invention is to provide a substrate wherein a layer comprising a principal component of nickel and a layer comprising a principal component of palladium are deposited on a glass substrate and wherein an electroconductive layer is deposited on the palladium layer.

Still another object of the present invention is to provide a method for producing a substrate, the method comprising a step of forming a layer comprising a principal component of nickel on a glass substrate, a step of forming a layer comprising a principal component of palladium on the nickel layer, and a step of forming an electroconductive layer on the palladium layer.

The substrate of the present invention can also be formed in such a way that, for enhancing adhesion of the layer comprising the principal component of nickel to the glass substrate, the nickel layer, the layer comprising the principal component of palladium, and the electroconductive layer are deposited after execution of a pretreatment such as a treatment of providing the surface of the glass substrate with catalytic nuclei.

The production method of the substrate according to the present invention may further comprise a step of a heat treatment for enhancing the adhesive strength of the layer comprising the principal component of nickel to the glass substrate and for enhancing the adhesive strength of the nickel layer to the layer comprising the principal component of palladium. The method may further comprise an activation treatment of the surface of the palladium layer in order to enhance the adhesive strength of the palladium layer to the electroconductive layer formed thereon.

When electroless plating is employed in formation of the palladium layer or in formation of the electroconductive layer, the invention allows use of a reducing agent that does not produce hydrogen as a major side reaction during deposition of metal.

DETAILED DESCRIPTION OF THE PREFERRED EMBODIMENTS

Figure 1A:
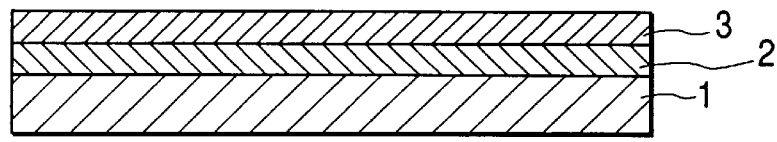
FIGS. 1A, 1B, 1C, 1D and 1E are schematic diagrams to show a form of the substrate according to the present invention.

The substrate and the production method thereof according to the present invention are those as described above.

According to the present invention, the undercoat plated layer is formed by depositing the layer comprising the principal component of nickel as a first layer and the layer comprising the principal component of palladium as a second layer on the glass substrate, whereby formation of the main electroconductive layer by subsequent pattern plating can be performed with sufficient adhesive strength, without using such a high-temperature process as to cause warp or strain in the glass substrate.

Embodiments of the present invention will be described in detail. FIGS. 1A to 1E and FIGS. 2 to 4 are schematic diagrams to show typical layer structures of the present invention. Materials for the glass substrate 1, which can be used in the present invention, are alkali-containing glasses generally known as soda lime glass or float glass (for example, trade name: U. F. F Glass available from Nippon Sheet Glass Co., Ltd.), glasses containing little alkali component, generally known as borosilicate glass (for example, trade name: #7059 available from Corning), glasses with an alkali leak preventing layer of $SiO_2$ or the like on the surface of float glass (for example, trade name: H coat glass available from Nippon Sheet Glass Co., Ltd.), and so on.

The layer 2 comprising the principal component of nickel is formed on the glass substrate 1 by electroless plating (FIG. 1A, FIG. 2, FIG. 3, or FIG. 4).

Prior to the formation of the layer comprising the principal component of nickel (hereinafter will also be referred to simply as "nickel layer"), a pretreatment for cleaning the glass substrate is carried out. In order to facilitate deposition of the nickel layer, it is also preferable to provide the surface of the glass substrate with catalytic nuclei, prior to the formation of the nickel layer.

The treatment for cleaning the glass substrate is normally carried out in several stages and a cleaning agent in this treatment can be a chemical of either a solvent type or a water type. When the glass substrate is a material whose surface is easy to deteriorate, such as soda lime glass, a treatment for removing the deteriorated layer of the surface is desirably first carried out by dissolving chromium trioxide in sulfuric acid, diluting it with pure water to prepare a desired aqueous solution (which will be called chromic acid-sulfuric acid), and immersing the substrate in it.

On this occasion, the glass cleaning agent of the water type can be selected from an aqueous solution of sodium hydroxide and commercially available alkaline surface adjustors. Examples of the commercially available products are $P_3$ siliron L or $P_3$ siliron HS available from Henkel Japan, OPC-380 Condiclean M available from OKUNO CHEMICAL INDUSTRIES CO., LTD., Melcleaner ITO-170 available from MELTEX INC., and so on.

A method for giving the catalytic nuclei onto the glass substrate 1 is selected from a method for substituting Sn adsorbed on the substrate surface for Pd to form the catalytic nuclei, a method for making the substrate surface adsorbing a Pd—Sn colloid and thereafter eliminating Sn to form the catalytic nuclei, a method for making the substrate surface adsorbing an Sn-free Pd complex and thereafter reducing it to form the catalytic nuclei of nonvalent metal Pd, a method for similarly making the substrate surface adsorbing an Sn-free Pd colloid and thereafter reducing it to form the catalytic nuclei of nonvalent metal Pd, and so on.

As a method used together with these methods there is also known a method for coating the glass substrate with a chemical having an amino group at one end of molecular chain, such as an amino silane coupling agent, which captures a precursor of the catalytic nuclei to increase a fixing rate of the catalytic nuclei on the surface of glass substrate. The above various nuclei providing methods are desirably selected and used, depending upon characteristics of the glass substrate used and characteristics of an electroless nickel plating solution used.

The glass substrate 1 provided with the catalytic nuclei as described above is immersed in the electroless nickel plating solution to form the nickel plated layer 2 (undercoat metal layer).

In the present invention the layer comprising the principal component of nickel is a film containing nickel as a principal component, formed by electroless plating. Specific examples of the layer comprising the principal component of nickel as described are a nickel plated film, a nickel-phosphorus plated film (hereinafter will also be referred to as "Ni—P plated film"), a film containing nickel and boron, and so on.

In either case the point is that the layer contains nickel as a principal component.

The electroless nickel plating solution used in the present invention had better not have a too large deposition rate, because the film form needs to be as dense as possible and include less defect, from the necessity for direct deposition on the glass substrate.

Experiments conducted by the present inventor clarified that the deposition rate of the electroless nickel plating solution considerably affects the final quality of film. Namely, an effective way for enhancing adhesion at the interface between the glass substrate and the plated layer is to control the deposition rate of nickel plating in the range of 0.01 ($\mu$m/min) to 0.15 ($\mu$m/min), and it is necessary to match the pretreatment system including the surface adjustment and provision of catalytic nuclei with the component design of the electroless nickel plating solution so as to keep the deposition rate in the mentioned range. When the deposition rate is off the range of 0.01 ($\mu$m/min) to 0.15 ($\mu$m/min), for example, when the deposition rate is smaller than 0.01 ($\mu$m/min), the plated film becomes discontinuous in an island pattern; if the deposition rate is greater than 0.15 ($\mu$m/min), uniformity of the plated film is degraded. Therefore, either case is not preferred.

Within combination of the pretreatment conditions with the plating solution to satisfy the above condition, even the electroless nickel plating solutions commercially available can also be suitably applicable to the production method of the present invention.

Then the layer 3 comprising the principal component of palladium is formed on the nickel plated layer 2 (FIG. 1A, FIG. 2, FIG. 3, or FIG. 4). In the present invention the layer comprising the principal component of palladium is a film containing palladium as a principal component, formed by electroless plating. Specific examples of the layer containing palladium as a principal component as described are a palladium plated film, a palladium-phosphorus plated film, and so on, and in either case the point is that the layer contains palladium as a principal component. The nickel plated layer 2 formed in the present invention functions as an undercoat metal layer for the electroconductive layer formed on this layer.

For formation of the palladium layer, the invention also allows us to employ an electroless palladium plating solution containing a reducing agent that does not produce hydrogen as a major side reaction during deposition of palladium.

In the present invention the reducing agent used for the electroless palladium plating can be one not producing hydrogen as a major side reaction during deposition of metal and the following examples are generally known as reducing agents used for electroless plating.

The examples include sodium hypophosphite, sodium borohydride, formaldehyde, dimethylamine borane, trimethylamine borane, methylmorpholino borane, diisopropylamine borane, L-sodium ascorbate, sodium phosphite, tartaric acid, glucose, glycerine, sodium N, N-diethylglycine, sodium formate, sodium citrate, titanium trichloride, hydrazine, thiourea, methylthiourea, N-methylthiourea, N-ethylthiourea, hydroquinone, bivalent cobalt compounds, etc., and many other reducing agents can also be used.

Here, whether hydrogen is produced as a major side reaction during deposition of palladium on the occasion of execution of the electroless palladium plating depends upon pH of a plating bath and a kind of a complex used, in addition to the oxidation-reduction potential, and in general, hydrogen is generated when the reducing agent is selected from dimethylamine borane, sodium borohydride, formaldehyde, sodium hypophosphite, etc., whereas hydrogen is not generated when the reducing agent is selected from hydrazine, thiourea, methylthiourea, N-methylthiourea, N-ethylthiourea, hydroquinone, sodium formate, citric acid, and so on.

By using the electroless palladium plating solution containing the reducing agent that does not produce hydrogen as a major side reaction during deposition of palladium as described above, the palladium plated layer can be deposited with avoiding the risk of exfoliation of film due to hydrogen absorption, on a nickel-phosphorus plated thin film on the glass member, where the adhesive strength of the interface is not enhanced sufficiently by the heat treatment.

In the present invention a treatment for immersing the substrate in a solution obtained by eliminating the metal component from the electroless palladium plating solution can also be carried out prior to the immersion into the electroless palladium plating solution. This treatment further enhances uniformity of film thickness of the palladium plated layer 3.

It is a matter of course that the electroless plating solution used in the present invention is desirably one forming a deposit film with smaller stress. In the case wherein smoothness intrinsic to the glass substrate is utilized with minimizing roughing of the substrate surface, the total film thickness will have the following appropriate range.

When the film thickness of the Ni plated layer 2 (undercoat metal layer) is A ($\mu$m) and the film thickness of the Pd plated layer 3 (undercoat metal layer) is B ($\mu$m), the present invention requires the following conditions; the total thickness of the two plated layers, A+B, is $0.05 \leq (A+B) \leq 1.5$ and preferably $0.06 \leq (A+B) \leq 1.0$; the film thickness A of the plated layer 2 is $0.04 \leq A$ and preferably $0.05 \leq A$; the film thickness B of the plated layer 3 is $0.02 \leq B$ and preferably $0.03 \leq B$.

The reasons are as follows. If A is smaller than 0.04 off the above condition a continuous film will not be deposited; if B is smaller than 0.02 the effect of deposition of the Pd plated layer will not be achieved; if (A+B) is smaller than 0.05 the plated film will become porous and exfoliation of film will become easier to occur during plating of the conductive pattern; if (A+B) is larger than 1.5 the risk of occurrence of exfoliation will increase due to increase in membrane stress in the plating solution.

It is desirable to avoid too large deposition rates of the Ni plating solution used in the present invention, because the Ni plated layer needs to have the form of film as dense as possible and with less defect, from the need for directly depositing the film on the glass substrate.

Figure 6:
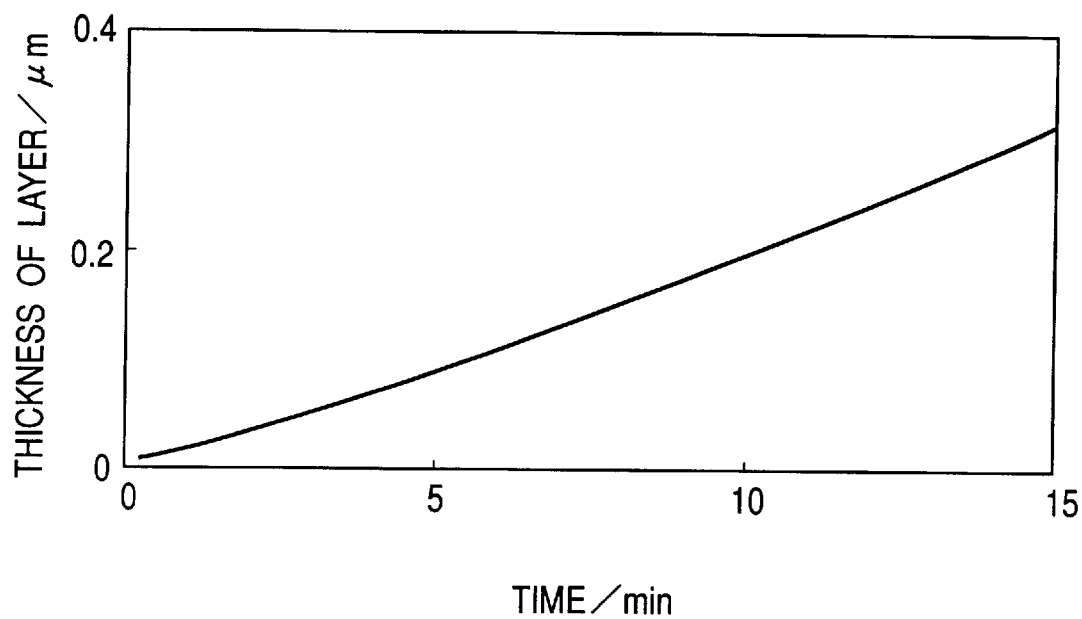
FIG. 6 is a graph to show a deposition rate of electroless Ni—P plating.

Experiments conducted by the present inventor clarified that the deposition rate of Ni—P plating greatly affects the final film quality. Namely, it is necessary for formation of the undercoat layer with high quality to control the deposition rate of Ni—P plating in the range of 0.01 ($\mu$m/min) to 0.03 ($\mu$m/min). FIG. 6 is a graph to show the correlation between the film thickness and plating time, as an example where the pretreatment system is matched with Ni—P plating so as to keep the deposition rate in the above range.

As long as a combination of the pretreatment conditions with the plating solution satisfies the above condition, even commercially available electroless Ni—P plating solutions can also be suitably used for the substrate and its production method of the present invention.

The plated layer 3 deposited on the plated layer 2 at this time is desirably selected from an electroless Pd plated layer not containing P if importance is placed on heat resistance of the electroconductive pattern, and an electroless Pd—P plated layer if importance is placed on adhesion upon pattern plating, rather than heat resistance. After these plated layers 2, 3 are deposited on the glass substrate 1, the glass substrate is washed well with ion-exchanged water (and further, water adhering to the substrate may be removed by air blow). After this, a heat treatment (annealing) of the glass substrate may be carried out, for example, in the ambience of 150° C. to 250° C. for 30 or more minutes.

The purpose of this heat treatment is to discharge hydrogen, which is a by-product, for example, of Ni—P deposition reaction and absorbed in the plated layer 2 (undercoat metal layer), so as to enhance adhesive strength between the glass substrate 1 and the plated layer 2, thereby preventing exfoliation of film from occurring during the subsequent photolithography-etching processes.

Then the surface of the palladium layer is coated with a photosensitive photoresist. The photosensitive photoresist used herein can be any photoresist as long as it has resistance against an etchant comprised of mixed acid, used in the next step. Commercially available products to satisfy these conditions are OFPR#700, OMR#83, and Ohdil α340 available from TOKYO OHKA KOGYO CO., LTD.

Figure 1B:
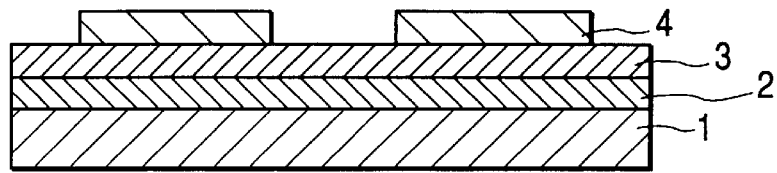

Either of these resists is applied onto the surface of Pd plated layer 3, then it undergoes exposure and development and thereafter baking, and a protective resist 4 is formed in a desired electroconductive pattern. FIG. 1B is a schematic diagram to show this state wherein the protective resist 4 is formed in the conductive pattern.

Then the glass substrate with this protective resist pattern formed thereon is immersed at room temperature in a solution of a mixture of concentrated nitric acid, concentrated hydrochloric acid, and acetic acid in the volume rate of conc nitric acid : conc hydrochloric acid : acetic acid= 10:10:1 (this solution will be called as mixed acid), thereby etching and removing the plated layers in portions not covered by the protective resist 4. After that, the glass substrate is washed with ion-exchanged water and then is immersed in a chemical for removing the resist 4, thereby removing the now unnecessary protective resist.

The chemical for removal of the resist 4 used herein can be a commercially available, dedicated remover to each used resist, for example, NMD-3 available from TOKYO OHKA KOGYO CO., LTD, and in addition thereto, a preferred remover is one obtained by adding a chelating agent such as gluconic acid to an aqueous solution which is alkaline with addition of sodium hydroxide and heating it at about 70° C.

Since the etching conditions vary depending upon the film thickness and heat treatment temperature of the nickel plated layer 2 and palladium plated layer 3, the mixture ratio and concentration of the aforementioned mixed acid may be adjusted properly. When the substrate has a fine line pattern, the substrate may be exposed to excimer light by use of a dielectric barrier discharge excimer lamp available from USHIO INC., prior to the etching with the mixed acid, thereby enhancing the water wettability of the palladium plated layer 3 exposed.

Figure 1C:
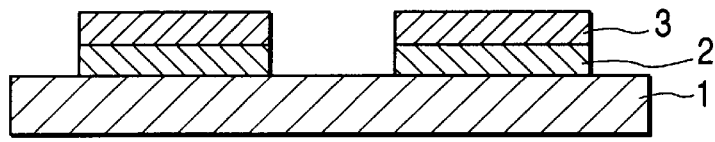

FIG. 1C is a schematic diagram of the pattern formed as described above.

In the present invention a step of carrying out a heat treatment of the substrate shown in FIG. 1C may be added before formation of the electroconductive layer on the substrate with the plated layers formed in the pattern. This heat treatment can be carried out, for example, in the ambience of 100° C. to 350° C., preferably in the ambience of 250° C. to 350° C., for example, for 30 to 60 minutes.

The purpose of this heat treatment is to oxidize cross sections of the Ni plated pattern exposed by etching, so as to minimize side etching occurring between the glass substrate 1 and the Ni plated layer 2 with chemicals after the pattern plating. The reason why the maximum of the heat treating temperature is 350° C. is to avoid the treatment at higher ambient temperature from causing surface oxidation of the Pd plated layer 3, thereby enhancing adhesion of the conductive layer formed on the Pd plated layer 3. The reason why the preferred minimum of the heat treatment temperature is 250° C. is that the effect of oxidation of the cross sections of the Ni plated pattern is weakened at temperatures lower than 250° C.

Figure 1D:
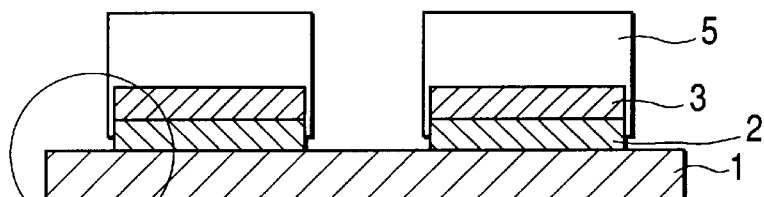

Then formation of the electroconductive layer 5 is carried out in the method of the present invention (FIG. 1D).

The electroconductive layer 5 can be either an electroplated layer or an electroless-plated layer.

Figure 1E:
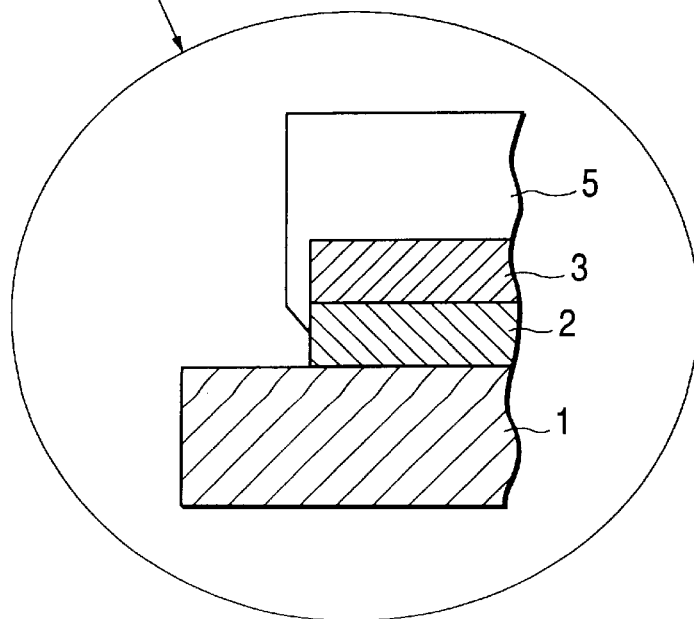
Figure 2:
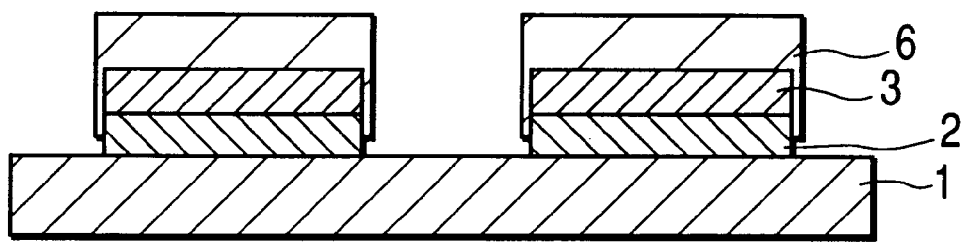
FIG. 2 is a schematic diagram to show another form of the substrate according to the present invention.
Figure 3:
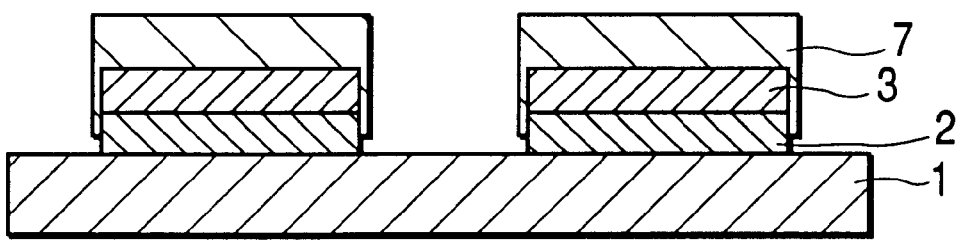
FIG. 3 is a schematic diagram to show another form of the substrate according to the present invention.
Figure 4:
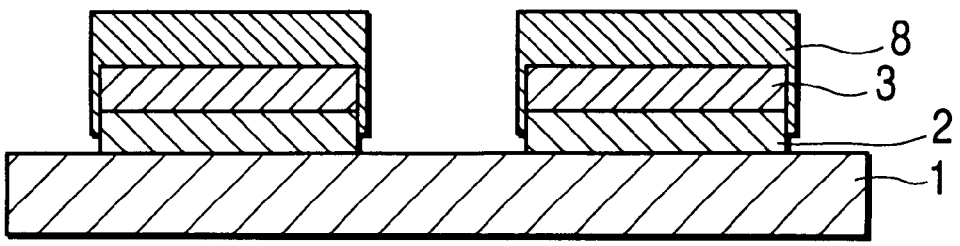
FIG. 4 is a schematic diagram to show another form of the substrate according to the present invention.

FIGS. 1D and 1E are schematic diagrams where silver (Ag) electroplating is employed. The electroplating is not limited to only silver, but the other metals including Au, Pt, Cu, Ni, and Pd can also be arbitrarily plated in the pattern, according to the purpose of use. As typical examples of these, FIG. 2 to FIG. 4 illustrate schematic diagrams in each of which a metal except for Ag is plated in the pattern. Specifically, FIG. 2 is a schematic diagram where an Au plated layer 6 is deposited on the patterned plated layers (the undercoat metal layers) 2, 3 by displacement gold plating. Similarly, FIG. 3 is a schematic diagram where a Pt plated layer 7 is deposited on the patterned plated layers (undercoat metal layers) 2, 3 by electroless plating, and FIG. 4 is a schematic diagram where a Cu plated layer 8 is deposited on the patterned plated layers (undercoat metal layers) 2, 3 by electroplating.

When the layer structure in the present invention was provided on the substrate as described above, the electroconductive pattern on the glass substrate 1 showed no film exfoliation even in formation of fine lines with the pattern width of 50 μm and also passed adhesion-peeling tests by adhesive tape. In contrast with it, when the pattern-plated layer is formed by Ag electroplating above the glass substrate with only an electroless Ni plated layer as an undercoat metal layer, without employing the layer structure shown in the present invention, the situations are shown in FIGS. 5A to 5E. This will be described below in order.

Figure 5A:
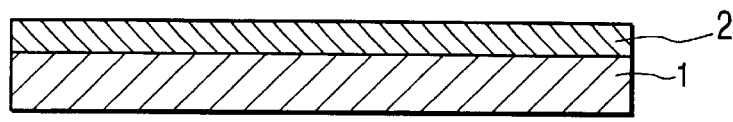
FIGS. 5A, 5B, 5C, 5D and 5E are schematic diagrams to show a structure of the substrate as a comparative example.
Figure 5B:
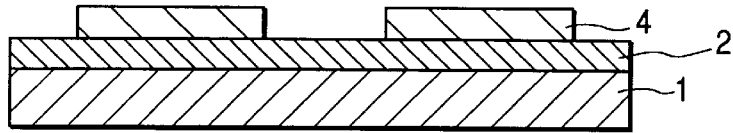
Figure 5C:
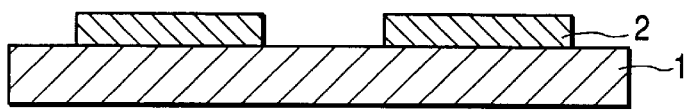
Figure 5D:
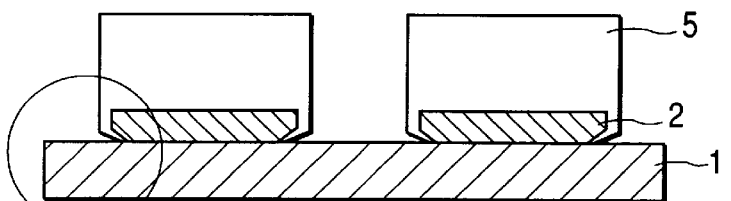
Figure 5E:
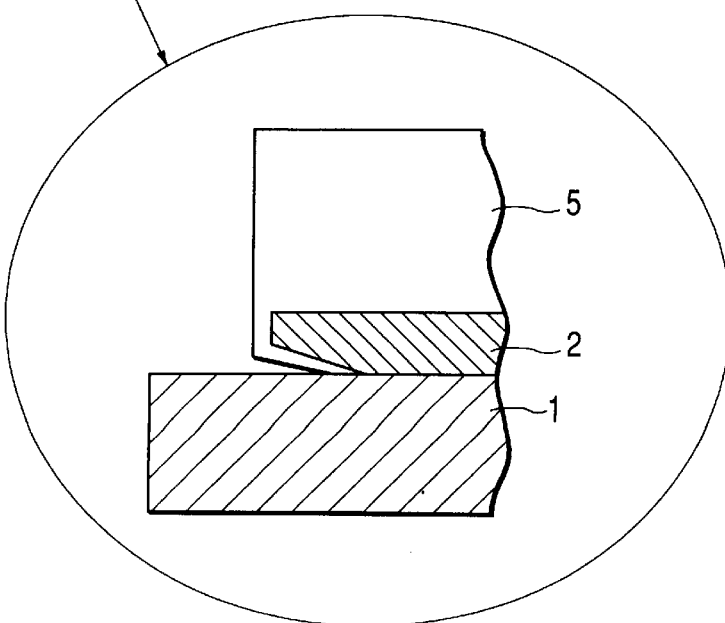

FIG. 5A is a schematic diagram where a Ni—P plated layer (undercoat metal layer) 2 is formed on the substrate 1 of soda lime glass by electroless plating. FIG. 5B is a schematic diagram where the above substrate is baked at the ambient temperature of 170° C. for two hours and thereafter the protective resist layer (protective pattern) 4 as described above is formed. Further, FIG. 5C is a schematic diagram where the above substrate is etched with the aforementioned mixed acid, thereafter the protective pattern 4 is removed, and then the pattern of Ni—P is formed on the substrate 1. FIGS. 5D and 5E are schematic diagrams where an Ag plated layer 5 is plated in the pattern on the above substrate by electroplating. Particularly, FIG. 5E shows an enlarged state where after the pattern plating process, the Ni—P plated layer (undercoat metal layer) 2 undergoes side etching, and wraparound of the pattern plated layer 5.

In this state where the plated layer 2 is side-etched and covered by the pattern plated layer, when fine line patterns of 200 μm or less are formed, the risk of exfoliation of film increases during pattern plating. When the substrate was baked at the ambient temperature of 300° C. for one hour in the stage of FIG. 5C, the oxide layer was also formed over the top surface of the Ni—P plated layer 2 and the Ag plated layer deposited by electroplating was peeled off during a water washing process after plating.

When the electroless plating method is employed as a method for forming the electroconductive layer 5, it can be selected from a variety of electroless plating methods. Among the electroless plating methods, desired methods are those using an electroless plating solution containing a reducing agent that does not produce hydrogen as a major side reaction during deposition of metal. When the electroplating is applied, a desired solution is an electroplating solution with the current efficiency close to 100%.

Here, the formation of the electroconductive layer is carried out desirably after the heat treatment for enhancement of adhesive strength between the glass member and the plated layer, different from the occasion of formation of the palladium layer of the second layer as described previously.

In this case, resistance of the interface against hydrogen absorption is improved remarkably, and it is thus adequately possible to perform the deposition using even an electroless plating solution containing a reducing agent that generates hydrogen as a side reaction, or an electroplating solution with not so high current efficiency. However, use of the process with reduced hydrogen absorption is preferred in the case of increase in the thickness of the deposit film or in the case of pattern plating into fine lines.

Figure 7:
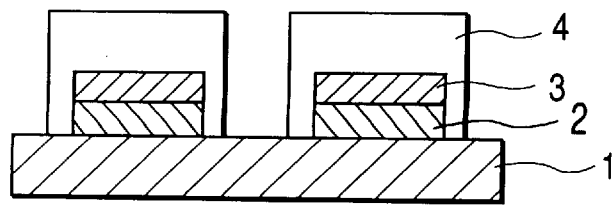
FIG. 7 is a schematic diagram to show a form of the substrate according to the present invention.
Figure 8A:
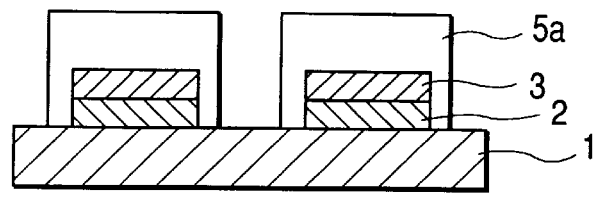
FIGS. 8A, 8B, 8C and 8D are schematic diagrams to show other forms of the substrate according to the present invention.
Figure 8B:
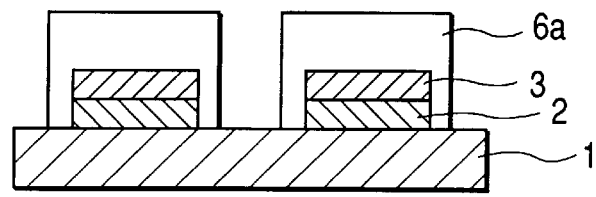

Described below referring to FIG. 7, FIG. 8A, and FIG. 8B are examples where the electroconductive layer is deposited using the electroless plating solution containing the reducing agent that produces less hydrogen in side reaction.

FIG. 7 is a schematic diagram where a platinum plated layer 4 is deposited on a pattern of nickel-phosphorus/palladium formed on the glass substrate, using an electroless platinum plating solution containing the reducing agent of hydrazine.

FIG. 8A is a schematic diagram where a silver plated layer 5a is deposited similarly, using an electroless silver plating solution containing the reducing agent of hydrazine.

FIG. 8B is a schematic diagram where a gold plated layer 6a is deposited similarly, using an electroless gold plating solution containing the reducing agent of a thiourea based compound.

Figure 8C:
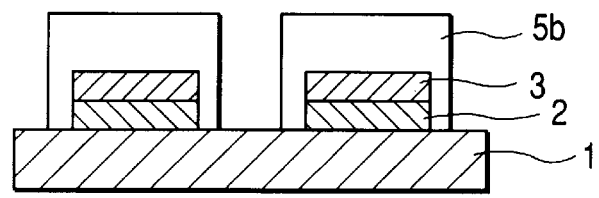
Figure 8D:
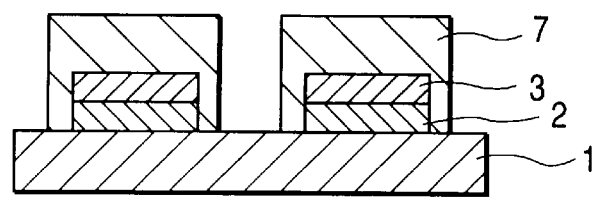
Figure 9A:
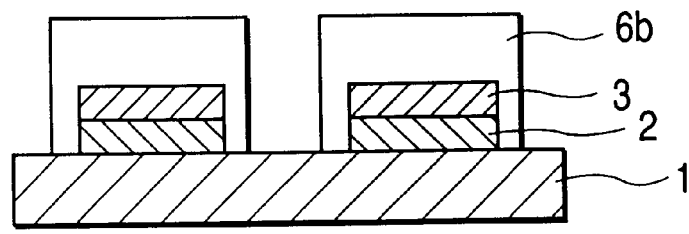
FIGS. 9A, 9B and 9C are schematic diagrams to show other forms of the substrate according to the present invention.

Further described referring to FIG. 8C, FIG. 8D, and FIG. 9A are examples where the electroconductive layer is deposited using the electroplating solution with high current efficiency.

FIG. 8C is a schematic diagram where a silver plated layer 5b is deposited on the pattern of nickel-phosphorus/palladium formed on the glass substrate, using a silver electroplating solution.

FIG. 8D is a schematic diagram where a copper plated layer 7 is deposited similarly, using a copper electroplating solution.

FIG. 9A is a schematic diagram where a gold plated layer 6b is deposited similarly, using a gold electroplating solution.

In addition to the above examples, the electroconductive layer can be any other deposit layer including the third layer and subsequent layer of nickel, palladium, or a metal that can be plated in a wet method, than those described above, and FIG. 9B and FIG. 9C are schematic diagrams to show such examples.

Figure 9B:
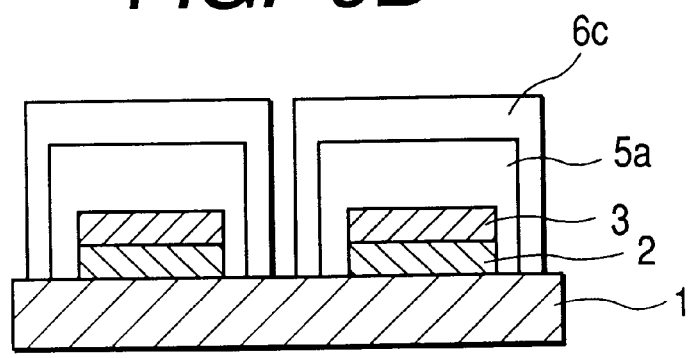

FIG. 9B is a schematic diagram where the surface portion of the silver plated layer 5a of the deposit pattern shown in FIG. 8A is replaced by the replacement gold plating method, thereby forming a gold plated layer 6c.

Figure 9C:
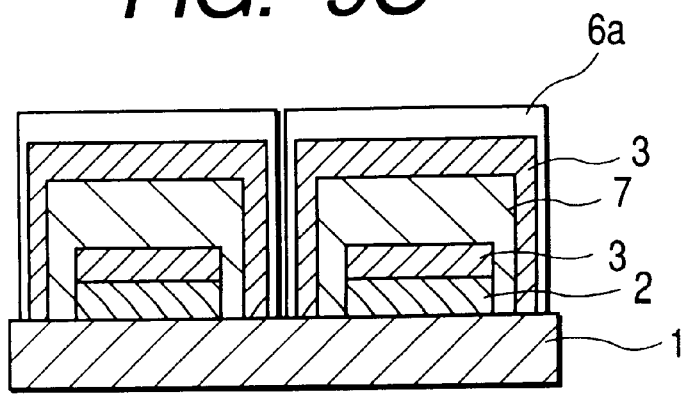

FIG. 9C is a schematic diagram where an electroless palladium plated layer 3 is deposited on the copper plated layer 7 of the deposit pattern shown in FIG. 8D and a further electroless gold plated layer 6a is deposited thereon.

In the present invention the adhesion of the electroconductive layer can be further enhanced by carrying out an activation treatment to activate the surface of the palladium layer after patterning after formation of the nickel layer and palladium layer on the glass substrate and before formation of the electroconductive layer 5.

The activation treatment is, for example, one or more of the following treatments [a], [b], [c].

[a] Bringing the palladium layer into contact with an alkaline aqueous solution containing a metal chelating agent.

[b] Bringing the palladium layer into contact with an acid aqueous solution containing at least one of chemicals of a hydrochloric acid type, a sulfuric acid type, and an iron salt type.

[c] Expose the palladium layer to light having wavelengths in the ultraviolet region.

The purpose of this treatment is to remove an oxide film formed in the surface of the deposited layer by the heat treatment at 150° C. to 250° C., which is desired to be carried out for enhancement of adhesion, and organic substance deposited on the plated layer after removal of the protective resist, thereby further enhancing the reactivity of plating during deposition and adhesion of the interface.

In the case of the treatment [a] carried out herein, the metal chelating agent used can be sodium gluconate, hexasodium triethylenetetramine hexaacetic acid, or the like, and the activation treatment is carried out by dissolving either of these and either sodium hydroxide or tetramethylammonium hydroxide in ion-exchanged water, heating it at about 50° C. to 80° C., and immersing the substrate therein.

In the case of the treatment [b], the activation treatment can be conducted by immersing the substrate in an aqueous solution obtained by diluting hydrochloric acid, sulfuric acid, or the like with ion-exchanged water, or an aqueous solution obtained by further adding a chemical of the iron salt type thereto. An example of the commercial product of the activating agent of this mixed type is OPC-91 available from OKUNO CHEMICAL INDUSTRIES CO., LTD.

Further, in the case of the treatment [c], the activation treatment can be carried out using the excimer light having a peak of spectral distribution at the wavelength of 172 (nm), as the light of wavelengths in the ultraviolet region for the exposure. A device for emitting such light of the wavelengths is, for example, an excimer light radiating device incorporating the dielectric barrier discharge excimer lamp available from USHIO INC.

Each of the above treatments [a], [b], [c] alone exhibits the sufficient effect as an activation treatment, but they can be employed in combination. For example, the treatment of [c] is first carried out, then the treatment of [a] is carried out, followed by sufficient washing with ion-exchanged water, and the treatment of [b] is carried out, whereby the time for each treatment can be decreased and the risk of damage to the substrate and the plated layers can be minimized.

By forming the electroconductive pattern on the glass substrate by the fabrication process in the present invention, excellent adhesion can be demonstrated up to the deposition pattern of line-and-space (hereinafter referred to simply as L/S) of about 5 ($\mu$m)/5 ($\mu$m), even in such a smooth state of the surface of the glass substrate that there is little decrease in transmittance of the visible light.

By use of the method described above, according to the present invention, the metalized glass substrate can be fabricated with excellent chemical resistance, excellent patterning property, and excellent deposition property, with high adhesion, with less film defect, and with suppressing deformation and distortion of the glass substrate even on a smooth glass substrate, and the metalized glass substrate thus obtained can be used, for example, as wires or electrodes for flat panel displays, and also be utilized as plated patterns for solder bumps.

This is because the deposition of the layer structure of glass substrate/nickel layer/palladium layer is carried out continuously and thereafter the thermal treatment, patterning, and deposition are carried out, whereby the film is formed with sufficient strength and uniformity as an undercoat film for deposition, though being a thin film. In this case, the attack of chemical can be prevented against portions with small thickness between plated nickel particles during the activation treatment, which was the problem upon execution of the heat treatment in the case of the single film of nickel.

The present invention will be described in further detail with specific examples thereof, but it should be noted that the present invention is by no means intended to be limited to these examples.

EXAMPLE 1

The glass substrate used herein was a soda lime glass measuring 100 mm×100 mm×thickness 1.1 mm (available from Nippon Sheet Glass Co., Ltd.), and pretreatments of the substrate were carried out according to the following procedures.

Pretreatment 1: chromium trioxide 100 (g/l) and conc sulfuric acid 200 (g/l) were mixed and ion-exchanged water was added thereto up to the total amount 1 (l), followed by heating to 60° C. The substrate was immersed in the solution of 60° C. for an hour and thereafter washed with ion-exchanged water.

Pretreatment 2: The substrate was immersed under ultrasonic vibration at the bath temperature 70° C. in 10 (N) NaOH solution for an hour and thereafter was washed with ion-exchanged water.

Pretreatment 3: $P_3$ siliron HS available from Henkel Japan was dissolved in 3 wt % in ion-exchanged water and the substrate was immersed under ultrasonic vibration at the bath temperature 70° C. in this solution for an hour. Thereafter, the substrate was washed with ion-exchanged water.

Pretreatment 4: A chemical containing ammonium fluoride was dissolved in ion-exchanged water and the substrate was immersed under liquid circulation at the bath temperature 25° C. in this acid solution for 20 minutes, followed by washing with ion-exchanged water.

Pretreatment 5: A chemical containing an amino group was dissolved in ion-exchanged water and the substrate was immersed under liquid circulation at the bath temperature 25° C. in this weak alkaline solution for 2 minutes, followed by washing with ion-exchanged water.

Pretreatment 6: $PdCl_2$ was dissolved in ionexchanged water to 0.52 (g/l) and pH thereof was adjusted to pH 6.5 with alkali. The substrate was immersed in this solution at the bath temperature 250° C. for 2 minutes and then immersed in ion-exchanged water.

Pretreatment 7: A hypophosphite was dissolved in ion-exchanged water to pH 5.3. The substrate was immersed in the solution at the bath temperature 25° C. for one minute and then immersed in ion-exchanged water.

After the above pretreatments (1) to (7), the glass substrate was put in the electroless Ni—P plating solution having the deposition rate as shown in the graph of FIG. 6 to undergo plating for 6 minutes. After that, the substrate was immersed in ion-exchanged water heated at 50° C. to wash away the electroless Ni—P plating solution adhering to the substrate surface. Then the substrate was put in the electroless Pd plating solution heated at 60° C. to undergo plating for one minute. The electroless Pd plating solution used in the present example was one of a type not causing co-deposition of P and B during deposition of Pd (for example, trade name: PARED available from KOJIMA CHEMICALS).

After completion of the Pd plating, the substrate was washed well under running water of ion-exchanged water and then ion-exchanged water adhering to the substrate was removed by air blow. Then the substrate underwent the heat treatment in the ambience of 170° C. for two hours to obtain the substrate having the layer structure shown in FIG. 1A.

Then the substrate after this heat treatment was slowly cooled down to room temperature and then OFPR-800 available from TOKYO OHKA KOGYO CO., LTD was applied onto the substrate by spin coater. Then the substrate was prebaked in the ambience of 90° C. for 30 minutes and underwent exposure with a mask having the pattern of 50 (μm). Then the pattern was developed by NMD-3 available from TOKYO OHKA KOGYO CO., LTD, followed by washing under running water of ion-exchanged water. Then the substrate was postbaked in the ambience of 140° C. for 30 minutes to obtain the substrate with the protective pattern shown in FIG. 1B.

This substrate with the protective pattern was immersed at room temperature in the aforementioned mixed acid solution for one minute and then was washed well under running water of ion-exchanged water to obtain the pattern of the undercoat metal layers shown in FIG. 1C. In the present example the substrate underwent the heat treatment in the ambience of 300° C. for 30 minutes, prior to pattern electroplating of Ag over the pattern of the undercoat metal layers.

The mean surface roughness of the plated surface of this substrate after the heat treatment and the mean surface roughness of the surface of the glass substrate after peeling of the plated layer were measured using a surface roughness measuring device available from Tencor Inc. The mean surface roughness of the Pd plated layer 3 was $Ra_1$=8.5 (Å) and the mean surface roughness of the glass substrate surface after peeling of the plated layers was $Ra_2$=3.9 (Å).

The electrolytic Ag plating solution used herein was S-900 available from N. E. CHEMCAT CORPORATION the plating was conducted at the bath temperature 60° C. and at the current density 0.2 (A/cm$^2$) for 2 minutes, followed by washing with ion-exchanged water. Then the substrate was baked in the ambience of 200° C. for an hour. The pattern plated substrate fabricated as described above had the layer structure as shown in FIG. 1D. The stripping test by tape was conducted and no line was peeled off thereby.

EXAMPLE 2

The substrate having the layer structure as shown in FIG. 1D was produced under the same conditions as in Example 1 except that the electroless Pd—P plating solution available from OKUNO CHEMICAL INDUSTRIES CO., LTD. replaced the electroless Pd plating solution in Example 1. The electroless Pd—P plating conditions employed herein were as follows.

Name of chemical: Muden noble Pd

Temperature of plating bath: 52° C.

Plating time: 3 minutes

The substrate obtained in this way had the layer structure as shown in FIG. 1D and no line was peeled off in the stripping test by tape.

EXAMPLE 3

The substrate having the Au plated layer 6 as shown in FIG. 2 was produced under the same conditions as in Example 1 except that the electroless Au plating solution available from Daiwa Kasei replaced the electrolytic Ag plating solution in Example 1. The electroless Au plating conditions employed herein were as follows.

Name of chemical: Daingold EL-2

Temperature of plating bath: 70° C,

Plating time: 20 minutes

The substrate obtained in this way had the layer structure as shown in FIG. 2 and no line was peeled off in the stripping test by tape.

EXAMPLE 4

The substrate having the Au plated layer 6 as shown in FIG. 2 was produced under the same conditions as in Example 2 except that the electroless Au plating solution available from Daiwa Kasei replaced the electrolytic Ag plating solution in Example 2. The electroless Au plating conditions employed herein were as follows.

Name of chemical: Daingold EL-2

Temperature of plating bath: 70° C.

Plating time: 20 minutes

The substrate obtained in this way had the layer structure as shown in FIG. 2 and no line was peeled off in the stripping test by tape.

EXAMPLE 5

The substrate having the Pt plated layer 7 as shown in FIG. 3 was produced under the same conditions as in Example 1 except that the electroless Pt plating solution available from N. E. CHEMCAT CORPORATION replaced the electrolytic Ag plating solution in Example 1. The electroless Pt plating conditions employed herein were as follows.

Name of chemical: EL-Pt (Pt concentration 3 g/l)

Temperature of plating bath: 70° C.

Plating time: 5 minutes

The substrate obtained in this way had the layer structure as shown in FIG. 3 and no line was peeled off in the stripping test by tape.

EXAMPLE 6

The substrate having the Pt plated layer 7 as shown in FIG. 3 was produced under the same conditions as in Example 2 except that the electroless Pt plating solution available from N. E. CHEMCAT CORPORATION replaced the electrolytic Ag plating solution in Example 2. The electroless Pt plating conditions employed herein were as follows.

Name of chemical: EL-Pt (Pt concentration 3 g/l)

Temperature of plating bath: 70° C.

Plating time: 5 minutes

The substrate obtained in this way had the layer structure as shown in FIG. 3 and no line was peeled off in the stripping test by tape.

EXAMPLE 7

The substrate having the Cu plated layer 8 as shown in FIG. 4 was produced under the same conditions as in Example 1 except that the electrolytic Cu plating solution replaced the electrolytic Ag plating solution in Example 1. The composition and conditions of electrolytic Cu plating employed herein were as follows.

Composition: Copper sulfate 75 (g/l), sulfuric acid 190 (g/l), chlorine ions 50 (ppm), Copper Gleam CLX-A from LeaRonal Japan Inc. 5 (ml/l), Copper Gleam CLX-C from LeaRonal Japan Inc. 5 (ml/l)

Temperature of plating bath: 30° C.

Current density: 0.025 (A/cm$^2$)

Plating time: 5 minutes

The substrate obtained in this way had the layer structure shown in FIG. 4 and no line was stripped off in the stripping test by tape.

EXAMPLE 8

The substrate having the Cu plated layer 8 as shown in FIG. 4 was produced under the same conditions as in Example 2 except that the electrolytic Cu plating solution replaced the electrolytic Ag plating solution in Example 2. The composition and conditions of electrolytic Cu plating employed herein were as follows.

Composition: Copper sulfate 75 (g/l), sulfuric acid 190 (g/l), chlorine ions 50 (ppm), Copper Gleam CLX-A from LeaRonal Japan Inc. 5 (ml/l), Copper Gleam CLX-C from LeaRonal Japan Inc. 5 (ml/l)

Temperature of plating bath: 30° C.

Current density: 0.025 (A/cm$^2$)

Plating time: 5 minutes

The substrate obtained in this way had the layer structure shown in FIG. 4 and no line was stripped off in the stripping test by tape.

COMPARATIVE EXAMPLE 1

The same pretreatments as in Example 1 were effected on the substrate of soda lime glass and the metalized substrate as shown in FIG. 5A was produced under the same electroless Ni—P plating conditions. This was baked in the ambience of 170° C. for 2 hours. Then the protective layer 4 as shown in FIG. 5B was formed on this Ni—P plated layer under the same process conditions as in Example 1. Then etching was carried out with the mixed acid, thereby forming the Ni—P plated pattern as shown in FIG. 5C.

In the present comparative example, the substrate was washed well after the above etching, but the heat treatment was not carried out. Then the substrate underwent the same electrolytic Ag plating as in Example 1, thereby producing the pattern-plated substrate having the layer structure as shown in FIG. 5D. At this time, some parts of the 50 ($\mu$m) pattern were peeled off under running water of ion-exchanged water after the above electrolytic Ag plating.

COMPARATIVE EXAMPLE 2

The substrate underwent the same treatments as in Example 1, up to formation of the Ni—P plated pattern shown in FIG. 5C, but in the present comparative example the above Ni—P pattern substrate was washed well and thereafter was baked in the ambience of 300° C. for an hour. Then this substrate underwent the same pattern AG plating as in Example 1. The Ag plated layer was not deposited in a film shape and completely peeled off during washing with ion-exchanged water after the plating.

The above examples are just some examples of the glass substrates with the conductive pattern produced based on the present invention, but it is a matter of course that the present invention is not limited to the specific examples described above and various modifications can be contemplated within the technological scope of the present invention.

EXAMPLE 9

The glass substrate used herein was a float glass substrate measuring 100 (mm)×100 (mm)×thickness 1.1 (mm) (available from Nippon Sheet Glass Co., Ltd.) and the pretreatments were carried out according to the following procedures.

[Pretreatment (1) of glass substrate]

Chromium trioxide (chromic anhydride) 60 (g/l) and conc sulfuric acid 180 (g/l) were mixed and ion-exchanged water was added up to the total amount 1 (l). This was heated to 70° C. and the substrate was immersed therein for an hour, followed by washing with ion-exchanged water.

[Pretreatment (2) of glass substrate]

The substrate was immersed under ultrasonic vibration in the bath of 10 (N) NaOH solution heated at 70° C. for an hour and thereafter was washed under ultrasonic vibration in ion-exchanged water heated at 50° C., followed by washing with ion-exchanged water at room temperature.

[Pretreatment (3) of glass substrate]

$P_3$ siliron HS available from Henkel Japan was dissolved in 3 (g/l) in ion-exchanged water and the solution was heated to 70° C. Then the substrate was immersed under ultrasonic vibration in the bath of the solution for an hour and thereafter washed under ultrasonic vibration in ion-exchanged water heated at 50° C., followed by washing with ion-exchanged water at room temperature.

[Pretreatment (4) of glass substrate]

The chemical containing ammonium fluoride was dissolved in ion-exchanged water to prepare an acid solution and the substrate was immersed in the acid solution controlled at 25±2° C. under liquid circulation for 5 minutes, followed by washing with ion-exchanged water at room temperature.

[Pretreatment (5) of glass substrate]

An aqueous solution was prepared by dissolving the chemical containing the amino group in ion-exchanged water and the substrate was immersed under liquid circulation in the aqueous solution controlled at 25±2° C. for 2 minutes, followed by washing with ion-exchanged water at room temperature.

[Pretreatment (6) of glass substrate]

Palladium chloride ($PdCl_2$) was dissolved in ion-exchanged water to amount 0.5 (g/l) and then pH was adjusted to pH 6.5 with alkali. After that, the bath temperature was controlled to 25±2° C. and the substrate was immersed in the bath for 2 minutes and then in ion-exchanged water at room temperature.

[Formation of nickel-phosphorus plated layer]

After the above pretreatments (1) to (6), the glass substrate was immersed in the electroless nickel-phosphorus plating solution having the aforementioned deposition rate, heated at 70° C., to undergo plating for 3 minutes, thereby forming the nickel-phosphorus alloy plated layer in the thickness 0.2 ($\mu$m) over the entire surface of the substrate.

[Formation of palladium plated layer]

After that, the electroless nickel-phosphorus plating solution adhering to the substrate surface was washed away in ion-exchanged water heated at 50° C., and then the substrate was immersed in the electroless palladium plating solution heated at 65° C. to undergo plating for 45 seconds, thereby depositing the palladium plated layer in the thickness 0.1 ($\mu$m). The electroless nickel-phosphorus plating solution used in the present example was one containing a hypophosphite as a reducing agent.

The electroless palladium plating solution was one not containing a reducing agent causing co-deposition of P and B during deposition of palladium, i.e., one not containing a reducing agent of a phosphate type and an amine-borane type, and further, not using a reducing agent that generates hydrogen as a side reaction of the deposition of plated layer. An example of commercially available electroless palladium plating solution to meet this condition is trade name: PARED available from KOJIMA CHEMICALS.

[Heat treatment step]

Figure 10A:
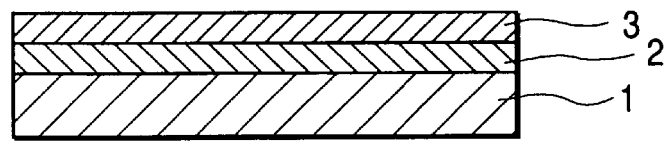
FIGS. 10A, 10B, 10C and 10D are schematic diagrams to show another form of the substrate according to the present invention.

After completion of the Pd plating, the substrate was washed well with ion-exchanged water and the ion-exchanged water adhering to the substrate was removed by nitrogen blow. Then the substrate was kept at 170° C. in the atmosphere for an hour to obtain the substrate having the layer structure shown in FIG. 10A.

Then the substrate after this heat treatment was cooled down to room temperature and thereafter exposed to the excimer light having the peak of spectral distribution at the wavelength of 172 (nm), emitted from the position of 5 (mm) to the substrate by the excimer light radiating device incorporating the dielectric barrier discharge excimer lamp available from USHIO INC., for 30 seconds.

[Pattern formation step]

Figure 10B:
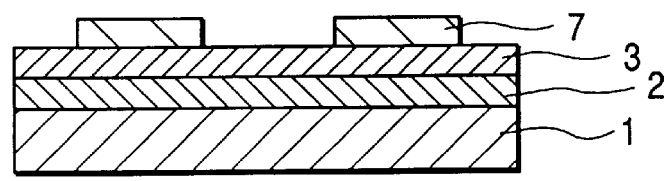

Then the trade name OFPR-800, which was a photoresist available from TOKYO OHKA KOGYO CO., LTD, was applied onto this substrate by spin coater, and thereafter the substrate was prebaked in the ambience of 90° C. for 30 minutes. This underwent exposure with a mask having the pattern of line-and-space (hereinafter referred to as L/S) of 50 ($\mu$m)/50 ($\mu$m) for evaluation of adhesive strength and the thin-line pattern for analysis of resolution. Further, the pattern was developed with trade name NMD-3 as a developing agent available from TOKYO OHKA KOGYO CO., LTD, followed by washing under running water of ion-exchanged water. Then the water was removed by nitrogen blow and the substrate was postbaked in the ambience of 140° C. for 30 minutes and cooled down to the room temperature. After that, the substrate was again exposed to the aforementioned excimer light for 30 seconds to obtain the substrate having the protective pattern shown in FIG. 10B. The aforementioned exposure to the excimer light can be omitted if the pattern width of the protective resist formed is wide enough.

The substrate with the protective pattern obtained above was immersed at room temperature in the aforementioned mixed acid solution for 45 seconds to etch and remove the exposed plated layers, followed by sufficient washing under running water of ion-exchanged water. Further, the substrate was immersed in a resist remover to remove the protective resist. The resist remover used herein was one obtained by dissolving 150 (g) of sodium hydroxide and 10 (g) of sodium gluconate in 1 (l) of ion-exchanged water and heated at 70° C., and the substrate was immersed in this bath for 20 seconds and then washed, thereby obtaining the substrate having the layer structure shown in FIG. 10C.

[Activation step]

Then the water adhering to this patterned substrate was removed and the substrate was exposed to the aforementioned excimer light for one minute. Then the substrate was immersed in a solution obtained by dissolving 200 (g) of sodium hydroxide and 20 (g) of sodium gluconate in ion-exchanged water and heated at 70° C., for one minute and washed well with ion-exchanged water, thus accomplishing the activation treatment.

This activation treatment sufficiently recovers the wettability of the exposed, plated surface normally by only the exposure to the excimer light, though depending upon the surface condition of the treated substrate.

[Formation step of surface metal layer]

Figure 10C:
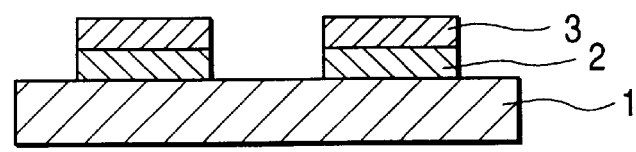
Figure 10D:
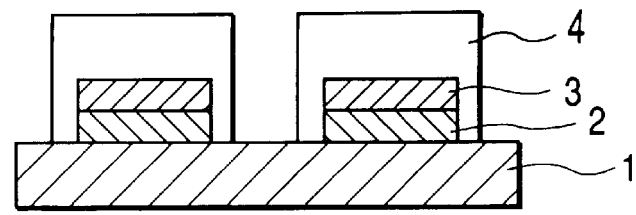

Further, the substrate after the above activation treatment was immersed in the electroless silver plating solution to form a silver plated layer 4, thus producing the layered pattern shown in FIG. 10D. The electroless silver plating solution used herein was trade name EL-Ag#31 available from N. E. CHEMCAT CORPORATION, and the plating was conducted in pH 10 and at the bath temperature 73° C. for an hour to deposit the silver plated layer in the thickness of 1.3 ($\mu$m).

[Results]

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

Further, the surface of the glass substrate 1, exposed on the substrate, was checked by trade name P-10, which was the surface roughness measuring device available from Tencor Inc., and the mean surface roughness thereof was 0.8 (nm).

EXAMPLE 10

On the pattern of L/S of 50 ($\mu$m)/50 ($\mu$m), after the electroless silver plating in Example 9, a further silver plated layer was deposited in the thickness 4 ($\mu$m) by electrolytic silver plating. The electrolytic silver plating solution used herein was trade name S-900 available from N. E. CHEMCAT CORPORATION, and the plating conditions were the bath temperature 60° C. and the current density 0.2 (A/cm$^2$).

The pattern-plated substrate produced as described above had the layer pattern as shown in FIG. 10D and this substrate underwent the stripping test by tape at the pattern of L/S of 50 ($\mu$m)/50 ($\mu$m). After the stripping test, no exfoliation was observed at the interface between the glass substrate and the plated layer, thus demonstrating good adhesion.

EXAMPLE 11

Figure 12:
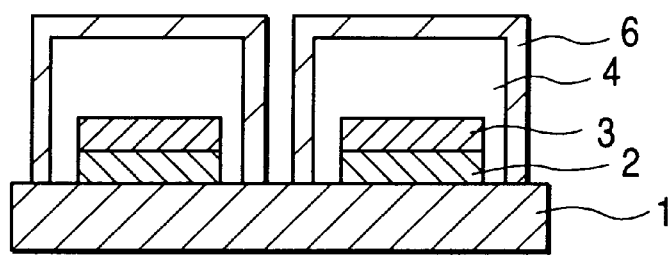
FIG. 12 is a schematic diagram to show still another form of the substrate according to the present invention.

On the silver plated layer 4 achieved in Examples 9 and 10, a gold plated layer 6 for antioxidation was further deposited in the thickness 0.05 ($\mu$m), thus producing the substrate having the layer structure as shown in FIG. 12.

The gold plating solution used herein was trade name: Daingold, which was the electroless gold plating solution available from Daiwa Kasei, and plating was carried out at the bath temperature 70° C.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

EXAMPLE 12

Figure 11:
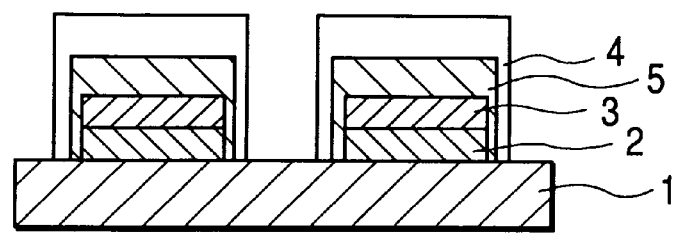
FIG. 11 is a schematic diagram to show still another form of the substrate according to the present invention.

In the same way as in Example 9, the pattern of nickel-phosphorus plated layer 2 and palladium plated layer 3 was formed on the glass substrate and activated, and thereafter a copper plated layer 5 was deposited thereon. Then, in the same manner as in Example 9, the silver plated layer 4 was deposited in the thickness 1.0 ($\mu$m), thus obtaining the substrate having the layer structure as shown in FIG. 11.

The copper plating solution used herein was trade name: CUST-2000, which was the electroless copper plating solution available from Hitachi Chemical Co., Ltd. (Hitachi Kasei Kogyo), and plating was carried out at the bath temperature 40° C. for 2 minutes, thus depositing the copper plated layer 5 in the thickness of 0.6 ($\mu$m).

The pattern plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

EXAMPLE 13

On the pattern of L/S of 50 ($\mu$m)/50 ($\mu$m), after the electroless silver plating in Example 12, a further silver plated layer 4 was deposited in the thickness 4 ($\mu$m) by electrolytic silver plating. The electrolytic silver plating solution used herein was trade name S-900 available from N. E. CHEMCAT CORPORATION, and the plating conditions were the bath temperature 60° C. and the current density 0.2 (A/cm$^2$).

The pattern-plated substrate produced as described above had the layer pattern as shown in FIG. 11 and this substrate underwent the stripping test by tape at the pattern of L/S of 50 ($\mu$m)/50 ($\mu$m). After the stripping test, no exfoliation was observed at the interface between the glass substrate and the plated layer, thus demonstrating good adhesion.

EXAMPLE 14

Figure 13:
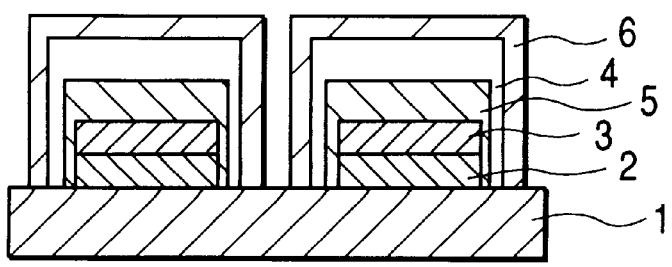
FIG. 13 is a schematic diagram to show still another form of the substrate according to the present invention.

On the silver plated layer 4 achieved in Examples 12 and 13, a gold plated layer 6 for antioxidation was further deposited in the thickness 0.05 ($\mu$m), thus producing the substrate having the layer structure as shown in FIG. 13.

The gold plating solution used herein was trade name: Daingold, which was the electroless gold plating solution available from Daiwa Kasei, and plating was carried out at the bath temperature 70° C.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

EXAMPLE 15

The substrates having the layer structures as shown in FIG. 10D to FIG. 13 were produced by the same treatments except that the activation treatment carried out in Examples 9 to 14 was carried out under the following conditions.

The substrates were prepared by removing the protective resist and carrying out the treatments up to the state shown in FIG. 10C, and then underwent the activation treatment in the following manner. The substrates were exposed to the aforementioned excimer light for one minute and then immersed in a treating solution obtained by dissolving 80 (g) of hexasodium triethylenetetramine hexaacetic acid (40 to 45% aqueous solution) and 200 (g) of sodium hydroxide in ion-exchanged water to amount 1 (l), at 70° C. for 5 minutes, followed by washing with ion-exchanged water. Then the substrates were immersed at room temperature in 2% aqueous solution of trade name OPC-91 available from OKUNO CHEMICAL INDUSTRIES CO., LTD. for 20 seconds, followed by washing with ion-exchanged water.

The pattern-plated substrates produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

EXAMPLE 16

The alkali-containing glass used in Examples 9 to 15 was replaced by trade name: #7059 available from Corning Inc., which was a glass substrate containing little alkali component, generally known borosilicate glass. The substrates having the layer structures as shown in FIG. 10D to FIG. 13 were prepared under the same treatment conditions as in Examples 9 to 15, except for the above.

The pattern-plated substrates produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 (um) had no disconnection, either.

EXAMPLE 17

The glass substrates used in Examples 9 to 16 were replaced by trade name: H coat glass available from Nippon Sheet Glass Co., Ltd., which was a substrate obtained by forming the $SiO_2$ layer as an alkali leak preventing layer on the surface of float glass. The substrates having the layer structures as shown in FIG. 10D to FIG. 13 were produced under the same treatment conditions as in Examples 9 to 15, except for the above.

The pattern-plated substrates produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

COMPARATIVE EXAMPLE 3

The alkali glass substrate underwent the pretreatments under the same conditions as in Example 9 and the nickel-phosphorus plated layer 2 was deposited in the thickness 0.3 $\mu$m thereon. After that, the substrate was kept at 170° C. in the atmosphere for an hour, and patterning was carried out under the same conditions as in Example 9, followed by removal of the protective resist. This comparative example is different from the present invention in that the palladium plated layer is excluded.

Prior to deposition of the silver plated layer on this pattern, the activation treatment was performed using the aqueous solution containing sodium gluconate and sodium hydroxide, which was the same as in Example 9, but the nickel-phosphorus plated layer 2 was deteriorated thereby. Thus the activation treatment was conducted by exposure to the excimer light and immersion in diluted hydrochloric acid for a short time, and the substrate was immersed in the electroless silver plating solution.

Figure 14A:
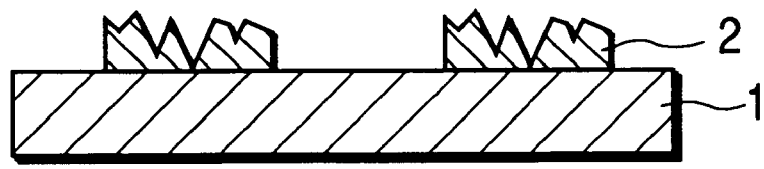
FIGS. 14A and 14B are schematic diagrams to show a structure of the substrate as a comparative example.
Figure 14B:
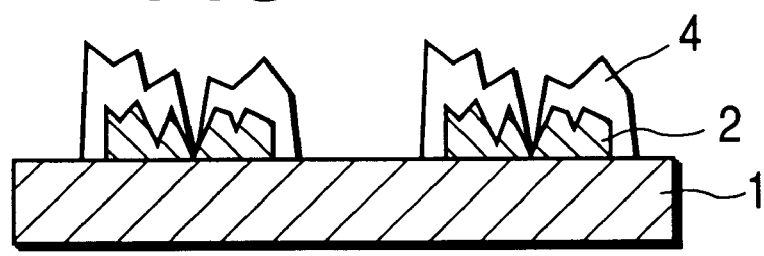

In the electroless silver plating solution, however, formation of the silver plated layer 4 and deterioration of the nickel-phosphorus plated layer 2 occurred simultaneously. When the stripping test by tape was carried out, exfoliation was observed at the interface between the glass substrate and the plated layer. Schematic diagrams in this state are shown in FIGS. 14A and 14B.

The above examples are just some examples of the pattern forming method on the glass substrate produced based on the present invention, but it is a matter of course that the present invention is not limited to the specific examples described above and various modifications can be contemplated within the technological scope of the present invention.

EXAMPLE 18

The glass substrate used herein was the float glass substrate measuring 100 (mm)×100 (mm)×thickness 1.1 (mm) (available from Nippon Sheet Glass Co., Ltd.) and the pretreatments were carried out according to the following procedures.

[Pretreatment (1) of glass substrate]

Chromium trioxide (chromic anhydride) 60 (g/l) and conc sulfuric acid 180 (g/l) were mixed and ion-exchanged water was added up to the total amount 1 (l). This was heated to 70° C. and the substrate was immersed therein for an hour, followed by washing with ion-exchanged water.

[Pretreatment (2) of glass substrate]

The substrate was immersed under ultrasonic vibration in the bath of 10 (N) NaOH solution heated at 70° C. for an hour and thereafter was washed under ultrasonic vibration in ion-exchanged water heated at 50° C., followed by washing with ion-exchanged water at room temperature.

[Pretreatment (3) of glass substrate]

$P_3$ siliron HS available from Henkel Japan was dissolved in 3 (g/l) in ion-exchanged water and the solution was heated to 70° C. Then the substrate was immersed under ultrasonic vibration in the bath of the solution for an hour and thereafter washed under ultrasonic vibration in ion-exchanged water heated at 50° C., followed by washing with ion-exchanged water at room temperature.

[Pretreatment (4) of glass substrate]

The chemical containing ammonium fluoride was dissolved in ion-exchanged water to prepare an acid solution and the substrate was immersed in the acid solution controlled at 25±2° C. under liquid circulation for 5 minutes, followed by washing with ion-exchanged water at room temperature.

[Pretreatment (5) of glass substrate]

An aqueous solution was prepared by dissolving the chemical containing the amino group in ion-exchanged water and the substrate was immersed under liquid circulation in the aqueous solution controlled at 25±2° C. for 2 minutes, followed by washing with ion-exchanged water at room temperature.

[Pretreatment (6) of glass substrate]

Palladium chloride ($PdCl_2$) was dissolved in ion-exchanged water to amount 0.5 (g/l) and then pH was adjusted to pH 6.5 with alkali. After that, the bath temperature was controlled to 25±2° C. and the substrate was immersed in the bath for 2 minutes and then in ion-exchanged water at room temperature.

[Forming steps of plated layers 2, 3]

After the above pretreatments (1) to (6), the glass substrate was immersed in the electroless nickel-phosphorus plating solution having the aforementioned deposition rate, heated at 70° C., to undergo plating for 3 minutes, thereby forming the nickel-phosphorus alloy plated layer in the thickness 0.2 ($\mu$m) over the entire surface of the substrate. After that, the electroless nickel-phosphorus plating solution adhering to the substrate surface was washed away in ion-exchanged water heated at 50° C., and then the substrate was immersed in the electroless palladium plating solution heated at 65° C. to undergo plating for 45 seconds, thereby depositing the palladium plated layer in the thickness 0.1 ($\mu$m). The electroless nickel-phosphorus plating solution used in the present example was one containing a hypophosphite as a reducing agent.

The electroless palladium plating solution was one not containing a reducing agent causing co-deposition of P and B during deposition of palladium, i.e., one not containing a reducing agent of the phosphate type and the amine-borane type, and further, not using a reducing agent that generates hydrogen as a side reaction of the deposition of the plated layer. An example of the commercially available electroless palladium plating solution to meet this condition is trade name: PARED available from KOJIMA CHEMICALS.

[Heat treatment step by low temperature process]

After completion of the Pd plating, the substrate was washed well with ion-exchanged water and the ion-exchanged water adhering to the substrate was removed by nitrogen blow. Then the substrate was kept at 170° C. in the atmosphere for an hour to obtain the substrate having the layer structure shown in FIG. 10A.

Then the substrate after this heat treatment was cooled down to room temperature and thereafter exposed to the excimer light having the peak of spectral distribution at the wavelength of 172 (nm), emitted from the position of 5 (mm) to the substrate by the excimer light radiating device incorporating the dielectric barrier discharge excimer lamp available from USHIO INC., for 30 seconds. (This is a treatment for enhancing the wettability of the substrate so as to enhance the uniform coating property of the resist and this treatment can be omitted.)

[Patterning step]

Then the trade name OFPR-800, which was a photoresist available from TOKYO OHKA KOGYO CO., LTD, was applied onto this substrate by spin coater, and thereafter the substrate was prebaked in the ambience of 90° C. for 30 minutes. This underwent exposure with a mask having the pattern of line-and-space (hereinafter referred to as L/S) of 50 ($\mu$m)/50 ($\mu$m) for evaluation of adhesive strength and the thin-line pattern for analysis of resolution. Further, the pattern was developed with trade name NMD-3 as a developing agent available from TOKYO OHKA KOGYO CO., LTD, followed by washing under running water of ion-exchanged water. Then the water was removed by nitrogen blow and the substrate was postbaked in the ambience of 140° C. for 30 minutes and cooled down to the room temperature. After that, the substrate was again exposed to the aforementioned excimer light for 30 seconds to obtain the substrate having the protective pattern shown in FIG. 10B. The aforementioned exposure to the excimer light can be omitted if the pattern width of the protective resist formed is wide enough.

The substrate with the protective pattern obtained above was immersed at room temperature in the aforementioned mixed acid solution for 45 seconds to etch and remove the exposed plated layers, followed by sufficient washing under running water of ion-exchanged water. Further, the substrate was immersed in the resist remover to remove the protective resist. The resist remover used herein was one obtained by dissolving 150 (g) of sodium hydroxide and 10 (g) of sodium gluconate in 1 (l) of ion-exchanged water and heated at 70° C., and the substrate was immersed in this bath for 20 seconds and then washed, thereby obtaining the substrate having the layer structure shown in FIG. 10C.

[Activation step]

Then the water adhering to this patterned substrate was removed and the substrate was exposed to the aforementioned excimer light for one minute. Then the substrate was immersed in a solution obtained by dissolving 200 (g) of sodium hydroxide and 20 (g) of sodium gluconate in ion-exchanged water and heated at 70° C., for one minute and washed well with ion-exchanged water, thus accomplishing the activation treatment. This activation treatment sufficiently recovers the wettability of the exposed, plated surface normally by only the exposure to the excimer light, though depending upon the surface condition of the treated substrate.

[Platinum plating step]

Further, the substrate after the above activation treatment was immersed in the electroless platinum plating solution to form the platinum plated layer 4, thus producing the layered pattern shown in FIG. 10D. The electroless platinum plating solution used herein was trade name EL-Pt available from N. E. CHEMCAT CORPORATION, which was of the type not generating hydrogen as a side reaction during deposition of platinum. Plating was carried out in pH 10 and at the bath temperature 70° C. for 30 minutes to deposit the platinum plated layer in the thickness of 0.24 ($\mu$m).

[Results]

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 ($\mu$m)/5 ($\mu$m) had no disconnection, either.

Further, the surface of the glass substrate 1, exposed on the substrate, was checked by trade name P-10, which was the surface roughness measuring device available from Tencor Inc., and the mean surface roughness thereof was 0.8 (nm).

EXAMPLE 19

The treatments up to the activation treatment were carried out in the same manner as in Example 18 and then the platinum plated layer was deposited by electrolytic platinum plating in the thickness of 0.5 ($\mu$m) on the pattern of L/S of 50 ($\mu$m)/50 ($\mu$m) in the layer structure shown in FIG. 10C.

The electrolytic platinum plating solution used herein was trade name Pt-745 available from N. E. CHEMCAT CORPORATION, and the plating conditions were pH 12.5, the bath temperature 77° C., and the current density 0.3 (A/cm$^2$).

The pattern-plated substrate produced as described above had the layer pattern as shown in FIG. 10D, and this substrate underwent the stripping test by tape at the pattern of L/S of 50 ($\mu$m)/50 ($\mu$m). After the stripping test, no exfoliation was observed at the interface between the glass substrate and the plated layer, thus demonstrating good adhesion.

EXAMPLE 20

The alkali-containing glass used in Examples 18 and 19 was replaced by trade name: #7059 available from Corning Inc., which was a glass substrate containing little alkali component, generally known borosilicate glass. The substrate having the layer structure as shown in FIG. 10D was prepared under the same treatment conditions as in Examples 18 and 19 except for the above.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by electron micrograph at this time that the pattern of L/S of 5 (μm)/5 (μm) had no disconnection, either.

EXAMPLE 21

The glass substrates used in Examples 18 to 20 were replaced by trade name: H coat glass available from Nippon Sheet Glass Co., Ltd. which was a substrate obtained by forming the $SiO_2$ layer as an alkali leak preventing layer on the surface of float glass. The substrate having the layer structure as shown in FIG. 10D was produced under the same treatment conditions as in Examples 18 to 20, except for the above.

The pattern-plated substrate produced in this way underwent the stripping test by tape at the pattern of L/S of 50 (μm)/50 (μm), and no exfoliation was observed at the interface between the glass substrate and the plated layer, thus demonstrating good adhesion.

It was also confirmed by electron micrograph at this time that the pattern of L/S of 5 (μm)/5 (μm) had no disconnection, either.

COMPARATIVE EXAMPLE 4

The alkali glass substrate underwent the pretreatments under the same conditions as in Example 18 and the nickel-phosphorus plated layer 2 was deposited in the thickness 0.3 μm thereon. After that, the heat treatment was carried out at 170° C. in the atmosphere for an hour, and patterning was carried out under the same conditions as in Example 18, followed by removal of the protective resist.

Prior to deposition of the platinum plated layer on this pattern, the activation treatment was performed using the aqueous solution containing sodium gluconate and sodium hydroxide, which was the same as in Example 18, but the nickel-phosphorus plated layer 2 was deteriorated thereby. Thus the activation treatment was conducted by exposure to the excimer light and immersion in diluted sulfuric acid for a short time, and after washed with ion-exchanged water, the substrate was immersed in the same electroless platinum plating solution as in Example 18.

In the electroless platinum plating solution, however, formation of the platinum plated layer 4 and deterioration of the nickel-phosphorus plated layer 2 occurred simultaneously. When the stripping test by tape was carried out, exfoliation was observed at the interface between the glass substrate and the plated layer. Schematic diagrams in this state are shown in FIGS. 14A and 14B.

COMPARATIVE EXAMPLE 5

The alkali glass substrate underwent the treatments under the same conditions as in Example 18 and the pattern shown in FIG. 10D was formed thereon. This was subjected to the same activation treatment as in Example 18 and the substrate was put into the electroless platinum plating solution. The electroless platinum plating solution used herein was IM-PT available from Nihon Kojundo Kagaku K. K., which was a plating solution of strong acid (which was not "alkaline" employed in the present invention), not containing the reducing agent that generates hydrogen as a side reaction during deposition of platinum, and the patterned substrate shown in FIG. 10D was put into the plating bath at the bath temperature 55° C.

Figure 15:
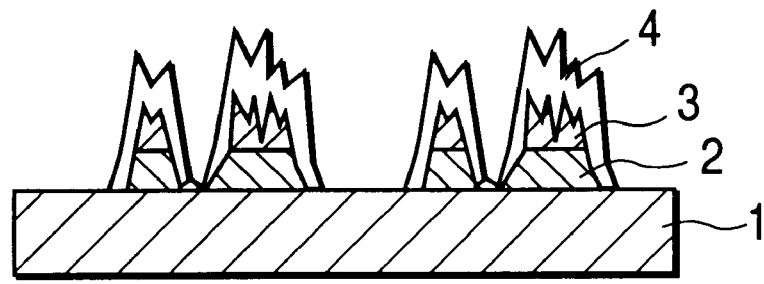
FIG. 15 is a schematic diagram to show another structure of the substrate as a comparative example.

However, exfoliation occurred at the interface between the glass substrate and the plated layer with a lapse of time. This is conceivably because etching took place in the palladium plated layer and the nickel-phosphorus plated layer because of the electroless platinum plating solution. A schematic diagram in this state is shown in FIG. 15.

The above examples are just some examples of the pattern forming method on the glass substrate produced based on the present invention, and it is a matter of course that the present invention is not limited to the specific examples described above and various modifications can be contemplated within the technological scope of the present invention.

EXAMPLE 22

The glass substrate used herein was the float glass substrate measuring 100 (mm)×100 (mm)×thickness 1.1 (mm) (available from Nippon Sheet Glass Co., Ltd.) and the pretreatments were carried out according to the following procedures.

[Pretreatment (1)]

Chromium trioxide (chromic anhydride) 60 (g/l) and conc sulfuric acid 180 (g/l) were mixed and ion-exchanged water was added up to the total amount 1 (l). This was heated to 70° C. and the substrate was immersed therein for an hour.

[Pretreatment (2)]

The substrate was immersed under ultrasonic vibration in the bath of 10 (N) NaOH solution heated at 75° C. for fifteen minutes and thereafter was washed under ultrasonic vibration in ion-exchanged water heated at 50° C.

[Pretreatment (3)]

$P_3$ siliron HS available from Henkel Japan was dissolved in 3 (g/l) in ion-exchanged water and the solution was heated to 70° C. Then the substrate was immersed under ultrasonic vibration in the bath of the solution for ten minutes and thereafter washed under ultrasonic vibration in ion-exchanged water heated at 50° C.

[Pretreatment (4)]

The chemical containing the amino group was dissolved in ion-exchanged water to prepare a solution and the substrate was immersed in the solution controlled at 25±2° C. under liquid circulation for two minutes.

[Pretreatment (5)]

Palladium chloride was dissolved in ion-exchanged water to amount 0.5 (g/l) and then pH was adjusted to pH 6.5 with sodium hydroxide. After that, the bath temperature was controlled to 25±2° C. and the substrate was immersed in the bath for 2 minutes.

After the above pretreatments (1) to (5), the glass substrate was immersed in the electroless nickel-phosphorus plating solution of pH 4.6 (containing the reducing agent of hypophosphite) having the aforementioned deposition rate, heated at 70° C., to undergo plating for 3 minutes, thereby forming the nickel-phosphorus plated layer 2 in the thickness 0.25 (μm) over the entire surface of the substrate. After that, the electroless nickel-phosphorus plating solution adhering to the substrate surface was washed away in ion-exchanged water heated at 50° C.

Further, this was immersed in the electroless palladium plating solution of pH 6 (containing the reducing agent of formate) heated at 90° C. for three minutes to deposit the palladium plated layer in the thickness of 0.2 (μm).

After completion of the Pd plating, the substrate was washed well with ion-exchanged water and the ion-exchanged water adhering to the substrate was removed by nitrogen blow. Then the substrate was baked at 170° C. in the atmosphere for an hour to obtain the substrate having the layer structure shown in FIG. 1A.

Then the substrate after this heat treatment was cooled down to room temperature and thereafter exposed to the excimer light having the peak of spectral distribution at the wavelength of 172 (nm), emitted from the position of 5 (mm) to the substrate by the excimer light radiating device incorporating the dielectric barrier discharge excimer lamp available from USHIO INC., for 30 seconds.

Then the trade name OFPR-800, which was a photoresist available from TOKYO OHKA KOGYO CO., LTD, was applied onto this substrate by spin coater, and thereafter the substrate was prebaked in the ambience of 90° C. for 30 minutes. This underwent exposure with a mask having the pattern of L/S of 50 ($\mu$m)/50 ($\mu$m) for evaluation of adhesive strength and the thin-line pattern for analysis of resolution. Further, the pattern was developed with trade name NMD-3 as a developing agent available from TOKYO OHKA KOGYO CO., LTD, followed by washing under running water of ion-exchanged water. Then the water was removed by nitrogen blow and the substrate was postbaked in the ambience of 140° C. for 30 minutes and cooled down to the room temperature. After that, the substrate was again exposed to the aforementioned excimer light for 30 seconds to obtain the substrate having the protective pattern shown in FIG. 1B. The aforementioned exposure to the excimer light can be omitted if the pattern width of the protective resist formed is wide enough.

The substrate with the protective pattern obtained above was immersed at room temperature in the aforementioned mixed acid solution for 80 seconds to etch and remove the exposed plated layers, followed by sufficient washing under running water of ion-exchanged water. Further, the substrate was immersed in the resist remover to remove the protective resist.

The resist remover used herein was one obtained by dissolving 150 (g) of sodium hydroxide and 10 (g) of sodium gluconate in 1 (l) of ion-exchanged water and heated at 70° C., and the substrate was immersed in this bath for 20 seconds and then washed, thereby obtaining the substrate having the layer structure shown in FIG. 1C.

The substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by SEM observation at this time that the pattern of L/S of 5 ($\mu$m)/5 ($\mu$m) had no disconnection, either.

The surface roughness of the glass substrate 1 at this time was measured by trade name P-10, which was the surface roughness measuring device available from Tencor Inc., and the mean surface roughness thereof was 0.6 (nm).

EXAMPLE 23

The glass substrate having the pattern of nickel-phosphorus/palladium, produced in Example 22, was exposed to the aforementioned excimer light for one minute and then immersed in the solution obtained by dissolving 50 (g) of tetramethylammonium hydroxide and 20 (g) of sodium gluconate in 1 (l) of ion-exchanged water and heated at 70° C., for five minutes. Further, this was immersed in ion-exchanged water heated at 70° C. for ten seconds and thereafter washed well with ion-exchanged water at room temperature. This substrate was immersed in the solution prepared by diluting sulfuric acid with ion-exchanged water to the concentration of 2 (ml/l) at room temperature for ten seconds, and then was washed well with ion-exchanged water at room temperature.

Then the substrate was immersed in the solution prepared by dissolving palladium chloride in ion-exchanged water to the concentration of palladium chloride of 15 (ppm) at room temperature for 20 seconds, and thereafter was washed well with ion-exchanged water.

This substrate was immersed in the electroless platinum plating solution of pH 10 (containing the reducing agent of hydrazine) heated at 70° C. to deposit the platinum plated layer 4 in the thickness of 0.1 ($\mu$m), thus forming the pattern shown in FIG. 7.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by SEM observation at this time that the pattern of L/S of 5 ($\mu$m)/5 ($\mu$m) had no disconnection, either.

The surface roughness of the glass substrate 1 at this time was measured by trade name P-10, which was the surface roughness measuring device available from Tencor Inc., and the mean surface roughness thereof was 0.6 (nm).

EXAMPLE 24

The glass substrate having the pattern of nickel-phosphorus/palladium, produced in Example 22, was subjected to the same activation treatment as in Example 23.

This substrate was immersed in the electroless silver plating solution of pH 10 (containing the reducing agent of hydrazine) heated at 75° C. to deposit the silver plated layer 5a in the thickness of 0.5 ($\mu$m), thereby forming the pattern shown in FIG. 8A.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by SEM observation at this time that the pattern of L/S of 5 ($\mu$m)/5 ($\mu$m) had no disconnection, either.

The surface roughness of the glass substrate 1 at this time was measured by trade name P-10, which was the surface roughness measuring device available from Tencor Inc., and the mean surface roughness thereof was 0.6 (nm).

EXAMPLE 25

The glass substrate having the pattern of nickel-phosphorus/palladium, produced in Example 22, was subjected to the same activation treatment as in Example 23.

This substrate was immersed in the electroless gold plating solution of pH 7 (containing the reducing agent of thiourea) heated at 70° C. to deposit the gold plated layer 6a in the thickness of 0.2 ($\mu$m), thereby forming the pattern shown in FIG. 8B.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by SEM observation at this time that the pattern of L/S of 5 ($\mu$m)/5 ($\mu$m) had no disconnection, either.

The surface roughness of the glass substrate 1 at this time was measured by trade name P-10, which was the surface roughness measuring device available from Tencor Inc., and the mean surface roughness thereof was 0.6 (nm).

EXAMPLE 26

The pattern of nickel-phosphorus/palladium was formed on the glass substrate in the same manner as in Example 22. The activation treatment was carried out as follows. The substrate was exposed to the aforementioned excimer light for one minute and further immersed in the solution prepared by dissolving 40 (g) of sodium hydroxide and 20 (g) of sodium gluconate in 1 (l) of ion-exchanged water and heated at 70° C., for five minutes. This was washed well with ion-exchanged water.

This substrate was immersed in the electrolytic silver plating solution to deposit the silver plated layer 5b in the thickness of 3 ($\mu$m), thus forming the pattern as shown in FIG. 8C.

The electrolytic silver plating solution used herein was trade name S-900 available from N. E. CHEMCAT CORPORATION and the plating conditions were the bath temperature 60° C. and the current density 0.2 (A/cm$^2$).

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

The surface roughness of the glass substrate 1 at this time was measured by trade name P-10, which was the surface roughness measuring device available from Tencor Inc., and the mean surface roughness thereof was 0.6 (nm).

EXAMPLE 27

The pattern of nickel-phosphorus/palladium was formed on the glass substrate in the same manner as in Example 22. The activation treatment was carried out as follows. The substrate was exposed to the aforementioned excimer light for one minute and further immersed in the solution prepared by dissolving 40 (g) of sodium hydroxide and 20 (g) of sodium gluconate in 1 (l) of ion-exchanged water and heated at 70° C., for five minutes. This was washed well with ion-exchanged water.

This substrate was immersed in the electrolytic copper plating solution to deposit the copper plated layer 7 in the thickness of 3 ($\mu$m), thus forming the pattern as shown in FIG. 8D.

The electrolytic copper plating solution used herein was the one having the following composition and plating was carried out at the bath temperature 30° C. and at the current density 0.025 (A/cm$^2$).

Composition: Copper sulfate 75 (g/l), sulfuric acid 190 (g/l), chlorine ions 50 (ppm), Copper Gleam CLX-A 5 (ml/l) (available from LeaRonal Japan Inc.), Copper Gleam CLX-C 5 (ml/l) (LeaRonal Japan Inc.)

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

The surface roughness of the glass substrate 1 at this time was measured by trade name P-10, which was the surface roughness measuring device available from Tencor Inc., and the mean surface roughness thereof was 0.6 (nm).

EXAMPLE 28

The glass substrate having the pattern of nickel-phosphorus/palladium, produced in Example 22, was exposed to the aforementioned excimer light for one minute and then immersed in the solution obtained by dissolving 50 (g) of tetramethylammonium hydroxide and 20 (g) of sodium gluconate in 1 (l) of ion-exchanged water and heated at 70° C., for five minutes. Further, this was immersed in ion-exchanged water heated at 70° C. for ten seconds and thereafter washed well with ion-exchanged water at room temperature.

This substrate was immersed in the aqueous solution prepared by adding 10 (ml) of OPC-91 available from OKUNO CHEMICAL INDUSTRIES CO., LTD. to 1 (l) of ion-exchanged water, at room temperature for ten seconds and thereafter washed well with ion-exchanged water at room temperature.

Then the substrate was immersed in the solution prepared by dissolving palladium chloride in ion-exchanged water to the concentration of palladium chloride of 15 (ppm) at room temperature for 20 seconds, and thereafter was washed well with ion-exchanged water.

This substrate was immersed in the electrolytic gold plating solution to deposit the gold plated layer 6b in the thickness of 0.1 ($\mu$m), thus forming the pattern shown in FIG. 9A.

The electrolytic gold plating solution used herein was K-710 Pure Gold available from KOJIMA CHEMICALS and plating was conducted at the bath temperature 60° C. and at the current density 0.20 (A/cm$^2$).

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

The surface roughness of the glass substrate 1 at this time was measured by trade name P-10, which was the surface roughness measuring device available from Tencor Inc., and the mean surface roughness thereof was 0.6 (nm).

EXAMPLE 29

The deposit pattern as shown in FIG. 8A was produced in the same manner as in Example 23 and this was washed well with ion-exchanged water. After that, it was immersed in a displacement gold plating solution to effect replacement of the surface layer of the silver plated layer 5a with gold to form the gold plated layer 6c in the thickness of 0.1 ($\mu$m), thus forming the pattern as shown in FIG. 9B.

The displacement gold plating solution used herein was Daingold EL-2 available from Daiwa Kasei and the substrate was immersed in the solution at the bath temperature 70° C. for 20 minutes.

The pattern-plated substrate produced in this way underwent the stripping test by tape at the pattern of L/S of 50 ($\mu$m)/50 ($\mu$m), and no exfoliation was observed at the interface between the glass substrate and the plated layer, thus demonstrating good adhesion.

It was also confirmed by SEM observation at this time that the pattern of L/S of 5 ($\mu$m)/5 ($\mu$m) had no disconnection, either.

The surface roughness of the glass substrate 1 at this time was measured by trade name P-10, which was the surface roughness measuring device available from Tencor Inc., and the mean surface roughness thereof was 0.6 (nm).

EXAMPLE 30

The deposit pattern as shown in FIG. 8D was produced in the same manner as in Example 27 and this was washed well with ion-exchanged water. After that, it was immersed in a treating solution containing 200 (ml/l) of PDC-10, which was a palladium activating agent available from Ishihara Yakuhin K. K., at the bath temperature 30° C. for one minute and thereafter was washed well with ion-exchanged water.

Then this substrate was immersed in the electroless palladium plating solution used in Example 22 to deposit the palladium plated layer 3 in the thickness of 0.2 (μm) and then the substrate was washed well. After that, the substrate was immersed in the electroless gold plating solution used in Example 25 to deposit the gold plated layer 6a in the thickness of 0.1 (μm), thus forming the pattern as shown in FIG. 9C.

The pattern-plated substrate produced in this way underwent the stripping test by tape at the pattern of L/S of 50 (μm)/50 (μm), and no exfoliation was observed at the interface between the glass substrate and the plated layer, thus demonstrating good adhesion.

The surface roughness of the glass substrate 1 at this time was measured by trade name P-10, which was the surface roughness measuring device available from Tencor Inc., and the mean surface roughness thereof was 0.6 (nm).

EXAMPLE 31

The float glass substrate (alkali-containing glass substrate) used in the preceding examples was replaced by trade name: #7059 available from Corning Inc., which was a glass substrate containing little alkali component, generally known borosilicate glass. The pattern-plated substrates were prepared under the same conditions as in each of the preceding examples except for the above condition.

The pattern-plated substrates produced in this way underwent the stripping test by tape at the pattern of L/S of 50 (μm)/50 (μm), and no exfoliation was observed at the interface between the glass substrate and the plated layer, thus demonstrating good adhesion.

It was also confirmed by SEM observation that the pattern-plated substrates produced using only the electroless plating method had no disconnection even in the pattern of L/S of 5 (μm)/5 (μm).

The surface roughness of the glass substrate 1 at this time was measured by trade name P-10, which was the surface roughness measuring device available from Tencor Inc., and the mean surface roughness thereof was 0.6 (nm).

EXAMPLE 32

The glass substrate used in the previous examples was replaced by trade name: H coat glass available from Nippon Sheet Glass Co., Ltd., which was the glass substrate prepared by forming the SiO$_2$ layer as an alkali leak preventing layer on the surface of float glass. The pattern-plated substrates were produced in the same manner as in each of the foregoing examples except for the above condition.

The pattern-plated substrates produced in this way underwent the stripping test by tape at the pattern of L/S of 50 (μm)/50 (μm), and no exfoliation was observed at the interface between the glass substrate and the plated layer, thus demonstrating good adhesion.

It was also confirmed by SEM observation that the pattern-plated substrates produced using only the electroless plating method had no disconnection even in the pattern of L/S of 5 (μm)/5 (μm).

The surface roughness of the glass substrate 1 at this time was measured by trade name P-10, which was the surface roughness measuring device available from Tencor Inc., and the mean surface roughness thereof was 0.6 (nm).

COMPARATIVE EXAMPLE 6

The same substrate as in Example 22 underwent the pretreatments under the same conditions as in Example 22 and the nickel-phosphorus plated layer 2 was deposited thereon in the thickness of 0.5 μm. Thereafter, the substrate was baked at 170° C. in the atmosphere for an hour and similarly patterned under the same conditions as in Example 22. Then the protective resist was removed.

Prior to deposition of the platinum plated layer on this pattern, the activation treatment was carried out in the same manner as in Example 23 and this treatment deteriorated the nickel-phosphorus plated layer 2. A schematic diagram this time is shown in FIG. 14A.

Thus, the activation treatment was conducted by exposure to the excimer light and immersion in diluted sulfuric acid for a short time and then the substrate was washed with ion-exchanged water. Then this was immersed in the same electroless platinum plating solution as in Example 23.

However, in the electroless platinum plating solution, formation of the platinum plated layer 4 and deterioration of the nickel-phosphorus plated layer 2 occurred simultaneously. After completion of plating, the stripping test by tape was carried out and it was observed that exfoliation occurred at the interface between the glass substrate and the plated layer. A schematic diagram this time is shown in FIG. 14B.

It is a matter of course that the examples described above are just examples of the metalizing method of the glass substrate prepared based on the present invention, and it should be noted that the present invention is not limited to the aforementioned specific examples but a variety of modifications can be contemplated within the technological scope of the present invention.

What is claimed is:

1. A coated substrate comprising a glass substrate, a first layer comprising a principal component of nickel, a second layer comprising a principal component of palladium, and an electroconductive layer deposited on said second layer comprising the principal component of palladium, and wherein when a film thickness of said first layer comprising a principal component of nickel is A μm and a film thickness of said second layer comprising a principal component of palladium is B μm, said A and said B satisfy the following conditions:

$$0.05 \leq (A+B) \leq 1.5,$$

and $$0.04 \leq A,$$

and $$0.02 \leq B.$$

2. The coated substrate according to claim 1, wherein said first layer comprising the principal component of nickel is formed by electroless plating.

3. The coated substrate according to claim 1, wherein said second layer comprising the principal component of palladium is formed by electroless plating.

4. The coated substrate according to claim 1, wherein said electroconductive layer is formed by electroless plating.

5. The coated substrate according to claim 1, wherein said electroconductive layer is formed by electroplating.

6. The coated substrate according to claim 1, wherein said first layer comprising the principal component of nickel is formed on a layer of catalytic nuclei provided on said glass substrate.

7. The coated substrate according to claim 1, wherein said electroconductive layer comprises a plated layer whose principal component is an element selected from the group consisting of Au, Ag, Cu, Ni, Pt, Pd, W and Mo.

8. The coated substrate according to claim 1, wherein said first layer comprising the principal component of nickel and said second layer comprising the principal component of palladium are patterned.

9. The coated substrate according to claim 2, wherein said first layer comprising the principal component of nickel is an Ni—P plated layer.

10. The coated substrate according to claim 3, wherein said second layer comprising the principal component of palladium is a Pd plated layer.

11. The coated substrate according to claim 3, wherein said second layer comprising the principal component of palladium is a Pd—P plated layer.

12. The coated substrate according to claim 1, wherein said A and said B satisfy a condition of $0.06 \leq (A+B) \leq 1.0$.

13. The coated substrate according to claim 1, wherein said A and said B satisfy conditions of $$0.06 \leq (A+B) \leq 1.0,$$

and $$0.05 \leq A,$$

and $$0.03 \leq B.$$

14. A method for producing a coated substrate, said method comprising a step of forming a glass substrate with a first layer comprising a principal component of nickel, a step for forming a second layer comprising a principal component of palladium on said second layer comprising the principal component of nickel, and a step for forming an electroconductive layer deposited on said second layer comprising the principal component of palladium, and wherein when a film thickness of said first layer comprising a principal component of nickel is A $\mu$m and a film thickness of said second layer comprising a principal component of palladium is B $\mu$m, said A and said B satisfy the following conditions:

$$0.05 \leq (A+B) \leq 1.5,$$

and $$0.04 \leq A,$$

and $$0.02 \leq B.$$

15. The method according to claim 14, wherein a heat treatment is carried out after formation of said second layer comprising palladium.

16. The method according to claim 15, wherein said heat treatment is carried out at a temperature of 100° C. to 350° C.

17. The method according to claim 14, wherein said first layer comprising the principal component of nickel is formed by electroless plating.

18. The method according to claim 14, wherein said second layer comprising the principal component of palladium is formed by electroless plating.

19. The method according to claim 18, wherein said second layer comprising the principal component of palladium is formed by the use of a plating solution containing a reducing agent that does not produce hydrogen as a side reaction during deposition of metal.

20. The method according to claim 14, wherein an activation treatment for activating the surface of said first layer comprising the principal component of palladium is carried out prior to said step of said electroconductive layer.

21. The method according to claim 20 wherein said activation treatment comprises at least one selected from the following treatments (a), (b), and (c):

(a) bringing said second layer comprising the principal component of palladium into contact with an alkaline aqueous solution containing a metal chelating agent;

(b) bringing said second layer comprising the principal component of palladium into contact with an acid aqueous solution containing at least one selected from chemical of a hydrochloric acid type, a sulfuric acid type, and an iron salt type;.

(c) exposing said second layer comprising the principal component of palladium to light having wavelengths in the ultraviolet region.

22. The method according to claim 21, wherein said alkaline aqueous solution containing said metal chelating agent contains either a gluconate or a triethylenetetramine hexaacetate and either sodium hydroxide or tetramethylammonium hydroxide.

23. The method according to claim 21, wherein the light having the wavelengths in said ultraviolet region has a peak of spectral distribution at the wavelength of 172 (nm).

24. The method according to claim 14, wherein said electroconductive layer is formed by electroless plating.

25. The method according to claim 24, wherein said electroless plating is carried out by use of a plating solution containing a reducing agent that does not produce hydrogen as a side reaction during deposition of metal.

26. The method according to claim 14, wherein said electroconductive layer is formed by electroplating.

27. The method according to claim 14, wherein said first layer comprising the principal component of nickel is formed on a layer of catalytic nuclei provided on the glass substrate.

28. The method according to claim 14, wherein said electroconductive layer comprises a plated layer whose principal component is an element selected from the group consisting of Au, Ag, Cu, Ni, Pt, Pd, W, and Mo.

29. The method according to claim 14, further comprising a step of patterning said first layer comprising the principal component of nickel and said second layer comprising the principal component of palladium.

* * * * *

UNITED STATES PATENT AND TRADEMARK OFFICE
CERTIFICATE OF CORRECTION

PATENT NO.      : 6,127,052
APPLICATION NO. : 09/093351
DATED           : October 3, 2000
INVENTOR(S)     : Yoshiaki Tomari et al.

It is certified that error appears in the above-identified patent and that said Letters Patent is hereby corrected as shown below:

COLUMN 1

Line 12, "There are" should read --In--; and "examples conventionally known" should read --examples,--;
    Line 13, "as substrates in which the" should read --an--;
    Line 14, "and" should read --by conventional--; and "methods" should read --methods.--.
    Line 15, "thereof. As an" should read --For--;
    Line 27, "over exposed" should read --overexposed--;
    Line 31, "is" should read --are--;
    Line 42, "poses additional" should be deleted;
    Line 43, "problems that" should read --increases--; and "becomes higher and that" should read --and--;
    Line 44, "in the case wherein" should read --when--;
    Line 57, "necessitated in" should read --needed--;
    Line 58, "order" should be deleted;
    Line 59, "nickel plated" should read --nickel-plated--;
    Line 60, "in the thickness" should read --thick--;
    Line 61, "substrate with omitting" should read --substrate, without--;
    Line 62, "treatment" should read --treatment,--; and
    Line 63, "increase" should read --an increase--.

COLUMN 2

Line 1, "to" should read --of--;
    Line 2, "deposit" should read --deposited--; and "is attempted to" should be deleted;
    Line 3, "remove" should read --removed--; and "there will often arise a problem that" should be deleted;
    Line 6, "so as to degrade" should read --to degrade--;
    Line 14, "a" should be deleted.

COLUMN 3

Line 50, "leak" should read --leakage--.

UNITED STATES PATENT AND TRADEMARK OFFICE
CERTIFICATE OF CORRECTION

PATENT NO.        : 6,127,052
APPLICATION NO.   : 09/093351
DATED             : October 3, 2000
INVENTOR(S)       : Yoshiaki Tomari et al.

It is certified that error appears in the above-identified patent and that said Letters Patent is hereby corrected as shown below:

COLUMN 4

Line 2, "is easy to deteriorate," should read --easily deteriorates,--;
      Line 24, "surface adsorbing an" should read --a surface adsorbing--;
      Line 52, "had better" should read --should--; and "a too large" should read --too large a--;
      Line 53, "form" should be --formed--;
      Line 54, "less defect, from" should read --few defects, due to--; and
      Line 63, "0.15 (μm/min), and it" should read --0.15 (μm/min). It--.

COLUMN 5

Line 6, "either case is not" should read --neither case is--;
      Line 16, "containing palladium as a principal component," should be deleted;
      Line 20, "on, and in either" should read --on. In any--;
      Line 25, "the invention also" should be deleted;
      Line 26, "allows us to" should read --one can--;
      Line 47, "pH" should read --the pH--; and "a kind" should read --the kind--;
      Line 48, "potential, and in" should read --potential. In--;
      Line 61, "with" should read --while--; and "exfoliation of film" should read --film exfoliation--;
      Line 64, "enhanced sufficiently" should read --sufficiently enhanced--.

COLUMN 6

Line 7, "deposit" should read --deposited--; and "smaller" should read --less--;
      Line 8, "with" should read --while--;
      Line 9, "roughing" should read --the roughness--;
      Line 14, "conditions;" should read --conditions:--;
      Line 20, "off the" should be deleted;
      Line 21, "above condition" should be deleted;
      Line 22, "deposition of" should read --depositing--;
      Line 25, "become easier to occur" should read --occur more easily--;
      Line 27, "occurrence of" should be deleted;
      Line 29, "deposition rates of" should read --a deposition rate for--;

UNITED STATES PATENT AND TRADEMARK OFFICE
CERTIFICATE OF CORRECTION

PATENT NO. : 6,127,052
APPLICATION NO. : 09/093351
DATED : October 3, 2000
INVENTOR(S) : Yoshiaki Tomari et al.

It is certified that error appears in the above-identified patent and that said Letters Patent is hereby corrected as shown below:

Line 31, "the form of" should read --a--;
    Line 32, "less defect," should read --fewer defects,--;
    Line 44, "condition," should read --conditions,--;
    Line 56, "air blow)." should read --blowing air).--; and
    Line 58, "in the ambience of" should read --at about--.

COLUMN 7

Line 17, "conc nitric acid: conc" should read --conc. nitric acid : conc.--;
    Line 18, "as mixed acid)," should read --"mixed acid"),--;
    Line 39, "of the" should read --of the exposed--;
    Line 40, "3 exposed." should read --3.--;
    Line 47, "in the" should be deleted--;
    Line 48, "ambience of" should read --at about--; and "in the ambience" should be deleted;
    Line 49, "of" should read --about--;
    Line 50, "cross" should read --cross- --; and
    Line 60, "cross" should read --cross- --.

COLUMN 8

Line 38, "an" should read --a--.

COLUMN 9

Line 2, "adequately" should be deleted;
    Line 6, "so" should read --such--;
    Line 8, "increase in" should read --increased--; "the thickness" should read -- thickness--; and "deposit" should read --deposited--;
    Line 12, "reaction." should read --reactions.--;
    Line 16, "of" should be deleted;
    Line 20, "of" should be deleted;
    Line 41, "deposit" should read --deposited--;
    Line 42, "subsequent" should read --a subsequent--;
    Line 43, "than" should read --other than--;

UNITED STATES PATENT AND TRADEMARK OFFICE
CERTIFICATE OF CORRECTION

PATENT NO. : 6,127,052
APPLICATION NO. : 09/093351
DATED : October 3, 2000
INVENTOR(S) : Yoshiaki Tomari et al.

It is certified that error appears in the above-identified patent and that said Letters Patent is hereby corrected as shown below:

Line 47, "deposit" should read --deposited--;
Line 52, "deposit" should read --deposited--; and
Line 57, "patterning" should read --patterning and--.

COLUMN 10

Line 7, "desired to be" should be deleted;
Line 8, "for enhancement of" should read --to enhance--; and "organic" should read --an organic--;
Line 36, "the" should be deleted;
Line 54, "less film defect," should read --fewer defects,--; and "suppressing" should read --suppressed--;
Line 56, "substrate, and the" should read --substrate. The--; and
Line 66, "can be prevented" should be deleted.

COLUMN 11

Line 1, "treatment," should read --treatment can be prevented,--;
Line 15, "conc" should read --conc.--; and
Line 42, "ionexchanged" should read --ion-exchanged--.

COLUMN 12

Line 1, "air blow." should read --air blowing.--; and "the" (second occurrence) should be deleted;
Line 2, "in the ambience of" should read --at--;
Line 4, "Then the substrate after" should read --After--; and "was" should read --the substrate was--;
Line 7, "spin" should read --a spin--;
Line 8, "in the ambience of" should read --at about--;
Line 13, "in the ambience of" should read --at about--;
Line 19, "water of" should be deleted;
Line 21, "the" (second occurrence) should be deleted; and "in the" should be deleted;

UNITED STATES PATENT AND TRADEMARK OFFICE
CERTIFICATE OF CORRECTION

PATENT NO. : 6,127,052
APPLICATION NO. : 09/093351
DATED : October 3, 2000
INVENTOR(S) : Yoshiaki Tomari et al.

It is certified that error appears in the above-identified patent and that said Letters Patent is hereby corrected as shown below:

Line 22, "ambience of" should read --at about--;
    Line 34, "CORPORATION" should read --CORPORATION,--; and
    Line 38, "in the ambience of" should read --at about--.

COLUMN 14

Line 29, "in the ambi-" should be deleted;
    Line 30, "ence of" should read --at about--;
    Line 41, "water of" should be deleted;
    Line 49, "in the ambience of" should read --at about--; and
    Line 50, "AG" should read --Ag--.

COLUMN 15
    Line 2, "conc" should read --conc.--.

COLUMN 16

Line 5, "nitrogen blow." should read --blowing nitrogen.--;
    Line 18, "spin" should read --a spin--;
    Line 19, "in the ambience of" should read --at about--;
    Line 26, "water of" should be deleted;
    Line 27, "nitrogen" should read --blowing nitrogen--;
    Line 28, "blow" should be deleted; and "in the ambience of" should read --at about--; and
    Line 40, "water of" should be deleted.

COLUMN 19

Line 29, "leak" should read --leakage--.

COLUMN 20

Line 18, "conc" should read --conc.--

UNITED STATES PATENT AND TRADEMARK OFFICE
CERTIFICATE OF CORRECTION

| | |
|---|---|
| PATENT NO. | : 6,127,052 |
| APPLICATION NO. | : 09/093351 |
| DATED | : October 3, 2000 |
| INVENTOR(S) | : Yoshiaki Tomari et al. |

It is certified that error appears in the above-identified patent and that said Letters Patent is hereby corrected as shown below:

COLUMN 21

Line 19, "nitrogen blow." should read --blowing nitrogen.--;
    Line 35, "spin" should read --a spin--;
    Line 36, "in the ambience of" should read --at about--;
    Line 43, "water of" should be deleted;
    Line 44, "nitrogen" should read --blowing nitrogen--;
    Line 45, "blow" should be deleted; and "in the ambience of" should read --at about--; and
    Line 57, "water of" should be deleted.

COLUMN 22

Line 60, "known" should read --known as--.

COLUMN 23

Line 11, "leak" should read --leakage--; and
    Line 40, "after" should read --after being--.

COLUMN 24

Line 19, "conc" should read --conc.--; and
    Line 63, "nitrogen blow." should read --blowing nitrogen.--.

COLUMN 25

Line 8, "spin" should read --a spin--;
    Line 9, "in the ambience of" should read --at about--; and
    Line 16, "water of" should be deleted;
    Line 17, "nitrogen blow" should read --blowing nitrogen--; and "in the" should be deleted.
    Line 18, "ambience of" should read --at about--; and
    Line 25, "water of" should be deleted.

COLUMN 29

Line 29, "known" should read --known as--;
    Line 50, "leak" should read --leakage--.

UNITED STATES PATENT AND TRADEMARK OFFICE
CERTIFICATE OF CORRECTION

PATENT NO. : 6,127,052
APPLICATION NO. : 09/093351
DATED : October 3, 2000
INVENTOR(S) : Yoshiaki Tomari et al.

It is certified that error appears in the above-identified patent and that said Letters Patent is hereby corrected as shown below:

COLUMN 32

Line 26, "chemical" should read --chemicals--;
Line 27, "type;." should read --type; and--; and
Line 28, "©" should read --(c)--.

Signed and Sealed this

Seventh Day of April, 2009

JOHN DOLL
*Acting Director of the United States Patent and Trademark Office*